United States Patent
Kusumoto et al.

(10) Patent No.: US 7,507,999 B2
(45) Date of Patent: Mar. 24, 2009

(54) SEMICONDUCTOR DEVICE AND METHOD FOR MANUFACTURING SAME

(75) Inventors: Osamu Kusumoto, Nara (JP); Makoto Kitabatake, Nara (JP); Kunimasa Takahashi, Ibaraki (JP); Kenya Yamashita, Kadoma (JP); Ryoko Miyanaga, Nara (JP); Masao Uchida, Ibaraki (JP)

(73) Assignee: Panasonic Corporation, Osaka (JP)

( * ) Notice: Subject to any disclaimer, the term of this patent is extended or adjusted under 35 U.S.C. 154(b) by 88 days.

(21) Appl. No.: 10/494,705

(22) PCT Filed: Jul. 9, 2003

(86) PCT No.: PCT/JP03/08736

§ 371 (c)(1), (2), (4) Date: May 6, 2004

(87) PCT Pub. No.: WO2004/008512

PCT Pub. Date: Jan. 22, 2004

(65) Prior Publication Data
US 2005/0173739 A1 Aug. 11, 2005

(30) Foreign Application Priority Data

Jul. 11, 2002 (JP) ............................ 2002-202527
Jan. 30, 2003 (JP) ............................ 2003-021692

(51) Int. Cl.
*H01L 21/00* (2006.01)
*H01L 29/15* (2006.01)
*H01L 31/0312* (2006.01)

(52) U.S. Cl. ........................................ 257/77; 438/931

(58) Field of Classification Search .................. 257/493, 257/77, 442, 335, E21.054, E21.055, E21.065; 438/931

See application file for complete search history.

(56) References Cited

U.S. PATENT DOCUMENTS 4,809,047 A 2/1989 Temple (Continued)

FOREIGN PATENT DOCUMENTS

EP 309290 3/1989

(Continued)

OTHER PUBLICATIONS

Toshiyuki Ohno, "Recent Progress in SiC-Based Device Processing", IEICE Transactions, the Institute of Electronics, Information and Communication Engineers, vol. J81-C-11, No. 1, pp. 128-133, Jan. 1998 and a partial English translation thereof.

(Continued)

*Primary Examiner*—Davienne Monbleau
*Assistant Examiner*—Monica D Harrison
(74) *Attorney, Agent, or Firm*—McDermott Will & Emery LLP

(57) ABSTRACT

An accumulation-mode MISFET comprises: a high-resistance SiC layer 102 epitaxially grown on a SiC substrate 101; a well region 103; an accumulation channel layer 104 having a multiple δ-doped layer formed on the surface region of the well region 103; a contact region 105; a gate insulating film 108; and a gate electrode 110. The accumulation channel layer 104 has a structure in which undoped layers 104b and δ-doped layers 104a allowing spreading movement of carriers to the undoped layers 104b under a quantum effect are alternately stacked. A source electrode 111 is provided which enters into the accumulation channel layer 104 and the contact region 105 to come into direct contact with the contact region 105. It becomes unnecessary that a source region is formed by ion implantation, leading to reduction in fabrication cost.

12 Claims, 16 Drawing Sheets

U.S. PATENT DOCUMENTS

| | | | |
|---|---|---|---|
| 4,882,609 | A | 11/1989 | Schubert et al. |
| 4,942,438 | A | 7/1990 | Miyamoto |
| 6,455,911 | B1 * | 9/2002 | Stephani et al. ............. 257/493 |
| 6,580,125 | B2 * | 6/2003 | Kitabatake et al. .......... 257/335 |
| 6,600,203 | B2 * | 7/2003 | Takahashi et al. ........... 257/442 |
| 6,995,396 | B2 * | 2/2006 | Takahashi et al. ............. 257/77 |

FOREIGN PATENT DOCUMENTS

| | | |
|---|---|---|
| JP | 62-271475 | 11/1987 |
| JP | 64-39073 | 2/1989 |
| JP | 64-82677 | 3/1989 |
| JP | 02-71563 | 3/1990 |
| JP | 09-82663 | 3/1997 |
| WO | WO 01/93339 | 12/2001 |
| WO | WO 02/43157 A1 | 5/2002 |

OTHER PUBLICATIONS

Osamu Kusumoto et al., "SiC Vertical DACFET (Vertical Delta-Doped Accumulation Channel MOSFET)", Materials Science Forum vols. 389-393, pp. 1211-1214, Trans Tech Publications, Switzerland, 2002.

Yokogawa, Toshiya., et al. "4H-SiC Delta-Doped Accumulation-Channel MOS FET." Materials Science Forum, vol. 389-393, pp. 1077-1080, Trans Tech Publications, 2002.

Hsu, W.C. et al. "A Quantum Well-Doped GaAs FET Fabricated by Low-Pressure Metal Oragnic Chemical Vapor Deposition." Solid State Electronics, vol. 34, No. 6, pp. 649-653, Elsevier Science Publishers, 1991.

Cole, M.W., et al. "Improved Ni based composite Ohmic contact to n-SiC for high temperature and high power device applications." Journal of Applied Physics, vol. 88, No. 5, pp. 2652-2653, American Institute of Physics, 2000.

Extended European Search Report, issued in European Patent Application No. EP 08011174.3-1235/1968104, dated Oct. 6, 2008.

Japanese Office Action, with English translation, issued in Japanese Patent Application No. JP 2003-021692, mailed Sep. 2, 2008.

Chinese Office Action dated Nov. 3, 2006.

* cited by examiner

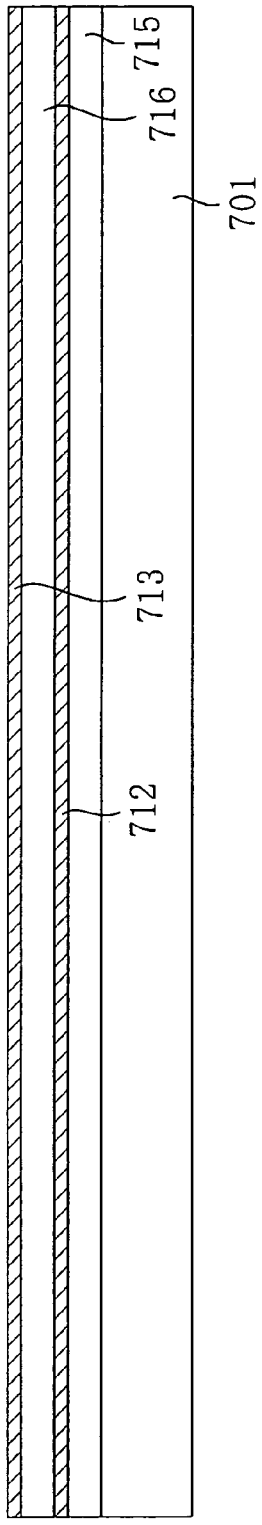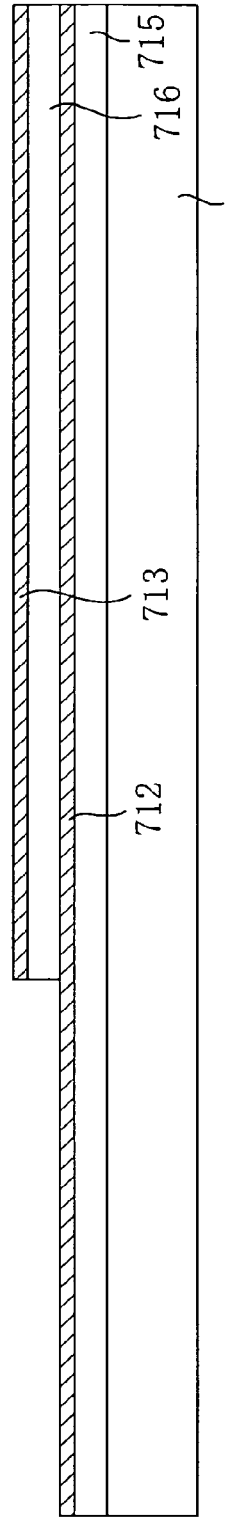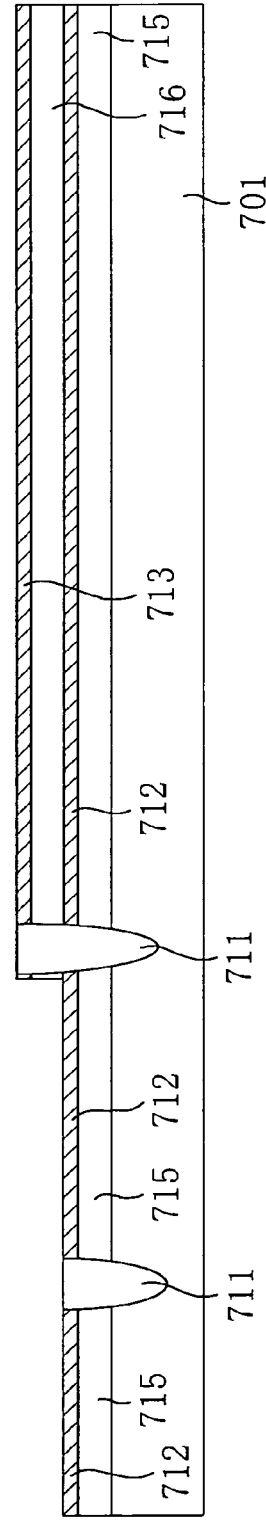

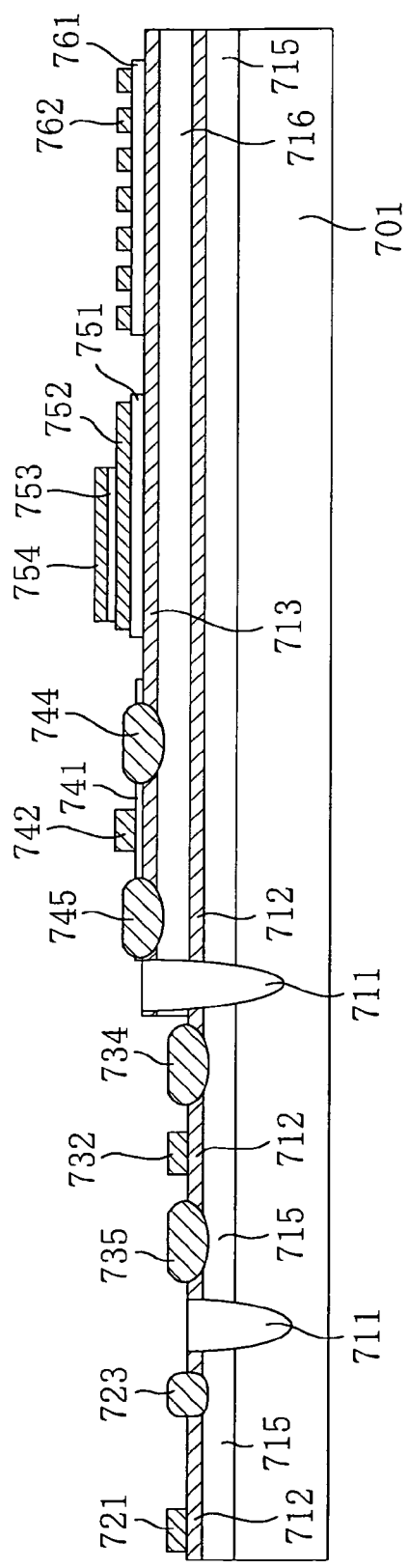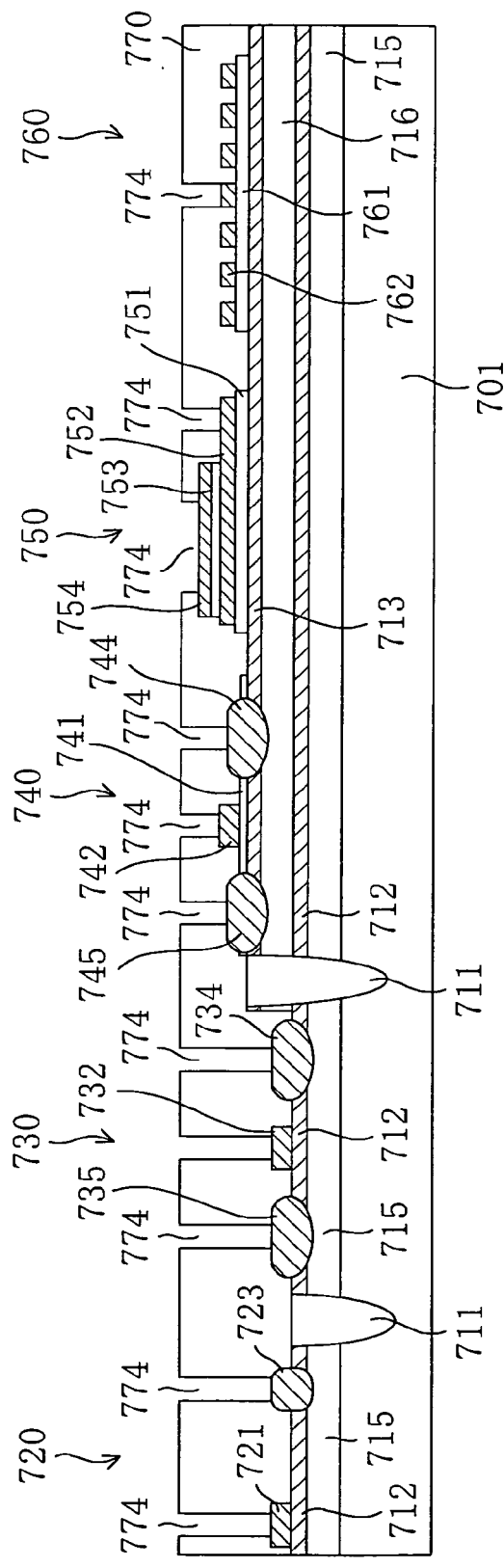

SEMICONDUCTOR DEVICE AND METHOD FOR MANUFACTURING SAME

TECHNICAL FIELD

The present invention relates to a semiconductor device formed using a compound semiconductor layer, and more particularly relates to a semiconductor device suitable for applications requiring a high breakdown voltage or a large current, and a method for fabricating the same.

BACKGROUND ART

Among various semiconductor devices, power devices are required to have a high breakdown voltage and handle a large current while achieving low loss. Although power devices using silicon (Si) semiconductors have conventionally been in common use, attention has in recent years been focused on power devices using compound semiconductors having a wide band gap, such as silicon carbide (SiC). Such compound semiconductor power devices are now being developed. In particular, silicon carbide semiconductors have a dielectric breakdown electric field ten times greater than silicon, and thus can maintain a relatively high reverse breakdown voltage in spite of a narrow depletion layer of a pn junction or a Schottky junction. Hence, silicon carbide semiconductors are expected to be materials for power devices having a low on-state resistance, a high breakdown voltage and low loss. This is because they can be used to reduce the thickness of the semiconductor layer and enhance the doping concentration.

FIG. 15 is a cross sectional view showing a double-implanted, accumulation-mode MISFET (ACCUFET) using SiC, which is suggested by the present inventors in Document 1 (see Osamu Kusumoto and the other 6 persons, "SiC Vertical DACFET", *Materials Science Forum*, No. 389-393, pp. 1211-1214).

As shown in this figure, the known accumulation-mode MISFET comprises a low-resistance SiC substrate 1001, a high-resistance SiC layer 1002 that is epitaxially grown on the SiC substrate 1001 and has a higher resistance than the SiC substrate 1001, a p-well region 1003 formed by selectively implanting ions into the surface region of the high-resistance SiC layer 1002, an accumulation channel layer 1004 formed on the surface region of the p-well region 1003 and including a multiple δ-doped layer formed by alternately stacking many δ-doped layers and undoped layers, and a source region 1006 formed by implanting ions into a part of the accumulation channel layer 1004 and containing an n-type impurity at a high concentration. A gate insulating film 1008 is formed over the accumulation channel layer 1004 and a part of the source region 1006, and a gate electrode 1010 is formed on the gate insulating film 1008. A part of the source region 1006 is removed to form a recess, and the well region 1003 is partly exposed at the bottom of the recess. A contact layer 1005 containing a p-type impurity at a high concentration is formed on the bottom of the recess, and a source electrode 1011 is provided on the contact layer 1005 to fill the recess and extend to the top of the source region 1006. The source electrode 1011 makes an ohmic contact with the source region 1006 and the contact layer 1005 by heat treatment. Furthermore, a drain electrode 1012 is formed on the back surface of the SiC substrate 1001 to make an ohmic contact with the SiC substrate 1001.

In this case, the n-type dopant concentration in the high-resistance SiC layer 1002 is usually about $1 \times 10^{15}$ cm$^{-3}$ through $3 \times 10^{16}$ cm$^{-3}$. This dopant concentration depends on a desired breakdown voltage. That is, this dopant concentration becomes lower with the increase of the desired breakdown voltage.

When the accumulation channel layer 1004 has a certain level of high impurity concentration, the channel resistance becomes low. However, in this case, the breakdown voltage decreases. The reason for this is that a depletion layer at the surface of the high-resistance SiC layer 1002 does not extend. That is, there is a trade-off relationship between high breakdown voltage and low loss. Therefore, the impurity concentration in the accumulation channel layer cannot be high.

According to Document 2 (Toshiyuki Ohno, "Recent Progress in SiC-Based Device Processing", *IEICE Transactions*, (the Institute of Electronics, Information and Communication Engineers, Vol. J81-C-II, No. 1, pp. 128-133, January, 1998)), nickel is often used for an ohmic electrode of an n-type silicon carbide semiconductor, and the nickel ohmic electrode is subjected to annealing at 900° C. or higher in an atmosphere of an inert gas, such as argon or nitrogen. As a result, nickel silicide (Ni$_2$Si) is formed to contribute to a reduced contact resistance. However, the document says that since the contact resistance of the ohmic electrode varies greatly depending on the doping concentration of silicon carbide, it is difficult to obtain an ohmic electrode at a doping concentration of $10^{17}$ cm$^{-3}$ or less. Therefore, an n-type source region having n-type impurities at a concentration of approximately $1 \times 10^{19}$ cm$^{-3}$ is formed.

On the other hand, the source electrode 1011 needs to directly contact the contact layer 1005, because the contact layer 1005, which is a heavily-doped p-type layer, applies a bias to the well region 1003. To cope with this, a recess is formed in the source region 1006 and the source electrode 1011 is formed along the wall surface of the recess. As a result, a voltage is directly applied from the source electrode 1011 to the contact layer 1005.

However, the structure of the known semiconductor device has the following problems.

Silicon carbide has a large binding energy between carbon and silicon. This makes it difficult to clear crystal defects formed therein due to ion implantation. In particular, when ions are implanted at a high concentration of approximately $1 \times 10^{19}$ cm$^{-3}$ as in the source region, the dose of ions is also large. In this case, defects may cause troubles. Therefore, ions need to be implanted with the substrate kept at a high temperature of 500° C. or higher, and the temperature of activation annealing after the implantation needs to be set at a high temperature of 1400° C. or higher. In turn, the fabrication process is complicated, resulting in increased cost.

In order to recover crystallinity further perfectly, the annealing temperature needs to be high. However, when annealing is conducted at 1500° C. or higher, silicon is selectively evaporated from the surface of SiC to form pits or cause step bunching, and flatness of the surface is degraded.

DISCLOSURE OF INVENTION

The present invention is made to solve these problems, and its object is to realize a semiconductor device which keeps the contact resistance of a source electrode low without forming a source region by ion implantation and has a high breakdown voltage and low loss.

A semiconductor device of the present invention may comprise: a substrate; an active region composed of a compound semiconductor provided on the substrate, said active region being obtained by alternately stacking at least one first semiconductor layer serving as a region through which carriers flow and at least two second semiconductor layers that contain an impurity for carriers at a higher concentration than the first semiconductor layer and are thinner than the first semiconductor layer; and at least one electrode of a conductor material entering into the active region from the top side to contact at least each of the second semiconductor layers.

Therefore, even when a doped layer such as source and drain regions is not provided by ion implantation, a semiconductor device serving as a transistor or a diode allowing carriers to flow through the active region composed of a compound semiconductor can be realized. Accordingly, for semiconductor devices using compound semiconductors and having high performance such as high power and high breakdown voltage, their fabrication cost can be reduced.

The semiconductor device may further comprise: a gate insulating film provided on the active region; and a gate electrode provided on the gate insulting film. When the at least one electrode is either one of source and drain electrodes, the semiconductor device serves as a MISFET. In this case, it can also serve as an accumulation-mode MISFET.

The semiconductor device may further comprise: a Schottky gate electrode provided on the active region. When the at least one electrode is source and drain electrodes provided with the gate electrode interposed therebetween, the semiconductor device serves as a MESFET.

The semiconductor device may further comprise: a Schottky gate electrode making a Schottky contact with the active region. When the electrode is a single ohmic electrode, the semiconductor device serves as a lateral Schottky diode.

When the compound semiconductor layer is a SiC layer, ion implantation requiring a large amount of labor particularly for the SiC layer need not be performed while advantage is taken of a large band gap. Therefore, the effect of reduction in fabrication cost becomes remarkable.

The at least one electrode is preferably composed of a conductor material containing at least nickel.

A method for fabricating a semiconductor device of the present invention using a part of a semiconductor layer provided on a substrate as an active region, may comprise the steps of: (a) forming an active region in which at least one first semiconductor layer and at least two second semiconductor layers are alternately stacked, said second semiconductor layers containing an impurity for carriers at a higher concentration than the first semiconductor layer and being thinner than the first semiconductor layer; (b) depositing a conductor film on the active region and then patterning the deposited conductor film in the form of an electrode; and (c) subjecting the conductor film to annealing after the step (b), thereby forming an electrode that enters into the active region from the surface thereof to contact at least each of the second semiconductor layers.

According to this method, a semiconductor device having an active region through which a large amount of carriers flow at a high speed can be obtained in the step (c) without ion implantation steps. More particularly, for semiconductor devices using compound semiconductors and having high performance such as high power and high breakdown voltage, their fabrication cost can be reduced.

In the step (c), the electrode is preferably brought into an ohmic contact with at least each of the second semiconductor layers.

It is preferable that the conductor film contains at least nickel and in the step (c), the annealing is carried out at a high temperature of 600° C. or higher in an atmosphere of an inert gas.

BRIEF DESCRIPTION OF DRAWINGS

FIG. 11A through 11C are cross sectional views showing the process steps from formation of first and second multilayer portions to formation of an isolation region in a fabrication process for a semiconductor device according to an eighth embodiment.

FIGS. 13A and 13B are cross sectional views showing the process steps from formation of an upper electrode of a capacitor to formation of a contact hole leading to a conductor part of each of elements in the fabrication process for a semiconductor device according to the eighth embodiment.

BEST MODE FOR CARRYING OUT THE INVENTION

Embodiment 1

"Structure of Semiconductor Device"

Figure 1:
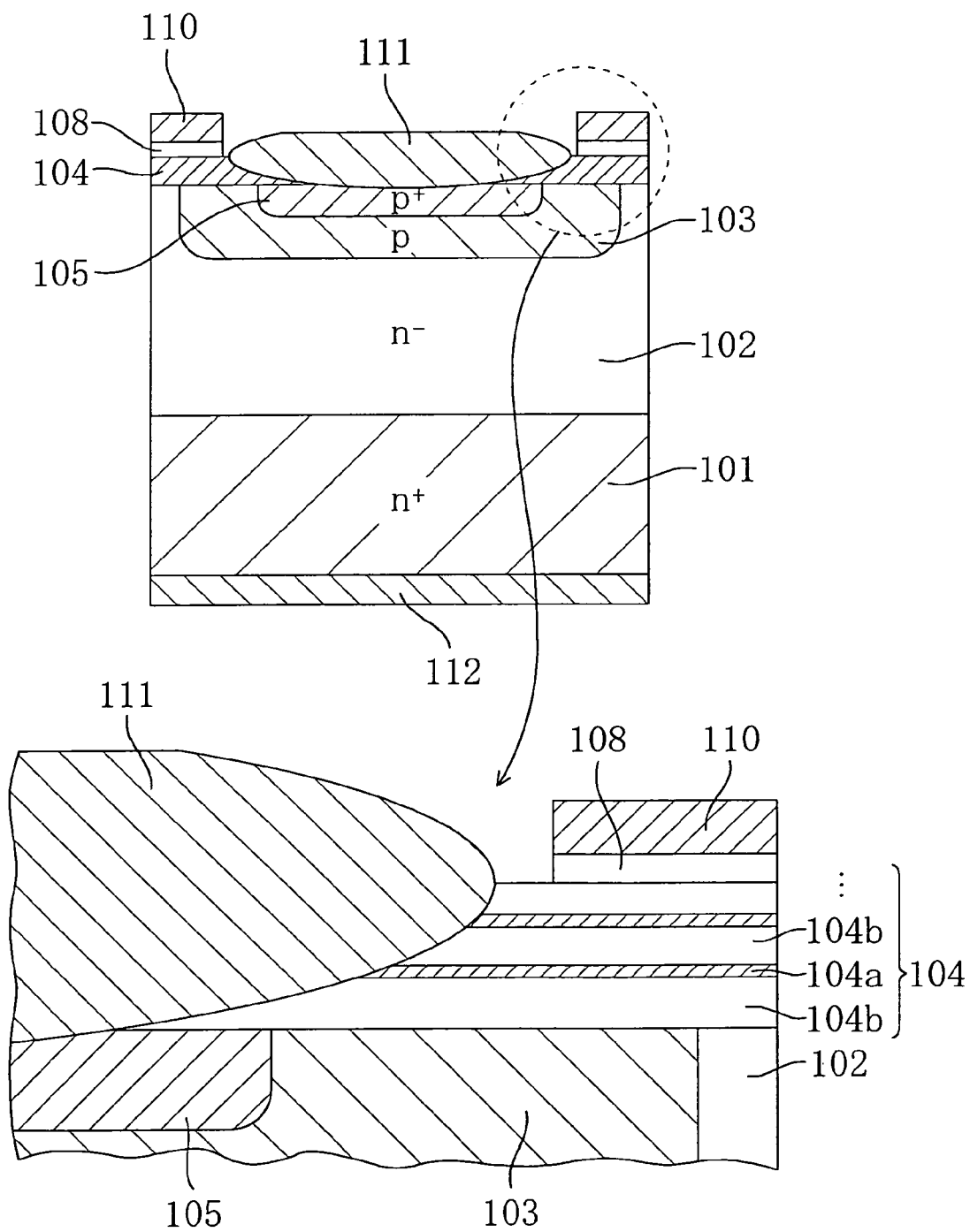
FIG. 1 is a cross sectional view showing a double-implanted, accumulation-mode MISFET (ACCUFET) using SiC according to a first embodiment of the present invention.

FIG. 1 is a cross sectional view showing a double-implanted, accumulation-mode MISFET (ACCUFET) using SiC according to a first embodiment of the present invention.

As shown in this figure, an accumulation-mode MISFET of this first embodiment comprises a low-resistance SiC substrate 101, a high-resistance SiC layer 102 that is epitaxially grown on the SiC substrate 101 and has a higher resistance than the SiC substrate 101, a p-type well region 103 formed by selectively implanting ions into the surface region of the high-resistance SiC layer 102, an n-type accumulation channel layer 104 having a multiple δ-doped layer (active region) formed on the surface region of the well region 103, and a contact layer 105 formed by implanting a p-type impurity at a high concentration into the well region 103. A gate insulating film 108 is formed on the accumulation channel layer 104, and a gate electrode 110 is formed on the gate insulating film 108. Furthermore, a drain electrode 112 is formed on the back surface of the SiC substrate 101 to make an ohmic contact with the SiC substrate 101.

As shown in the lower part of FIG. 1 under magnification, the accumulation channel layer 104 has a structure in which two undoped layers 104b (first semiconductor layers) of about 40 nm thickness composed of undoped SiC single crystals and two δ-doped layers 104a (second semiconductor layers) of about 10 nm thickness having a peak concentration of an n-type impurity of $5 \times 10^{17}$ cm$^{-3}$, are alternately stacked, and an undoped layer 104b of about 40 nm thickness is further stacked thereon. The δ-doped layer 104a is formed sufficiently thin to allow spreading movement of carriers to the undoped layer 104b under a quantum effect. The δ-doped layer 104a is obtained using a crystal growing device and a crystal growing method both disclosed in the specifications and drawings of Japanese Patent Applications No. 2000-58964 and 2000-06210. Effects and benefits brought by the provision of this multiple δ-doped layer are as disclosed in Japanese Patent Applications No. 2002-500456 and 2001-566193.

This embodiment is characterized in that a source electrode 111 is provided which enters into the accumulation channel layer 104 and the contact layer 105 by reaction with SiC and comes into direct contact with the contact layer 105. There is formed no source region that would conventionally have been formed by implanting impurities into the accumulation channel layer 104 and the well region 103 at high concentration. The source electrode 111 is composed of a nickel silicide layer obtained by sequentially forming an accumulation channel layer 104 and a nickel layer thereon and then allowing nickel to react with SiC by annealing. During this annealing, nickel enters into the accumulation channel layer 104 and the contact layer 105 principally by diffusion. Therefore, the source electrode 111 substantially makes an ohmic contact with the δ-doped layer 104a located in the accumulation channel layer 104, and also substantially makes an ohmic contact with the contact layer 105. The depth to which nickel enters into these layers after annealing can be adjusted in accordance with the initial thickness of the nickel film and annealing conditions.

Figure 2A:
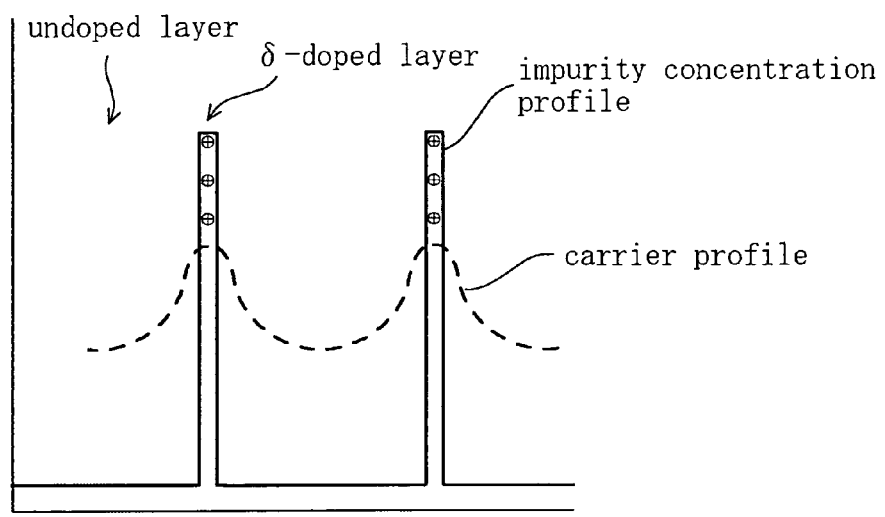
FIG. 2A is a diagram schematically showing the relationship between the concentration profile of nitrogen that is an n-type impurity and carrier profile in the depthwise direction of a multiple δ-doped layer.
Figure 2B:
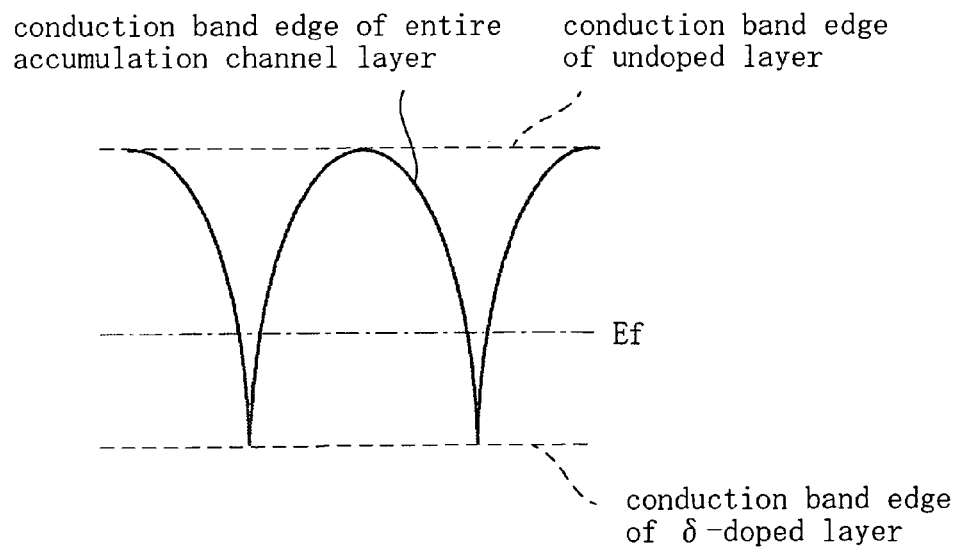
FIG. 2B is a partial band diagram showing the shape of a conduction band edge along the depthwise direction.

FIG. 2A is a diagram schematically showing the relationship between the concentration profile of nitrogen that is an n-type impurity and carrier profile in the depthwise direction of a multiple δ-doped layer, and FIG. 2B is a partial band diagram showing the shape of a conduction band edge along the depthwise direction.

As shown in FIG. 2A, the carrier scattering by impurity ions in the undoped layer is reduced. Therefore, a high electron mobility is obtained especially in the undoped layer. As shown in FIG. 2B, the conduction band edge of the whole active region has a shape connecting the conduction band edge of the δ-doped layer and the conduction band edge of the undoped layer, both shown by the broken lines in this figure. More particularly, quantum levels resulting from a quantum effect occur in the δ-doped layer 104a, and the wave function of electrons localized in the δ-doped layer 104a expands to a certain degree. What results is a state of distribution in which electrons are present not only in the δ-doped layer 104a but also in the undoped layer 104b. If the potential of the multiple δ-doped layer is increased in this state so that electrons have spread out from the δ-doped layer 104a to the undoped layer 104b under a quantum effect, electrons are constantly supplied to the δ-doped layer 104a and the undoped layer 104b. Since the electrons flow in the undoped layer 104b of low impurity concentration, carrier scattering by impurity ions is reduced, thereby providing a high channel mobility. On the other hand, when the device is in the off state, the whole multiple δ-doped layer is depleted and electrons are not present in the accumulation channel layer 104. Therefore, the breakdown voltage is defined by the undoped layer 104b of low impurity concentration, so that a high breakdown voltage can be obtained in the entire accumulation channel layer 104. Accordingly, in the ACCUFET having a structure in which the accumulation channel layer 104 is utilized to pass a large current between the source and drain, a high channel mobility and a high breakdown voltage can be achieved at the same time. In the state where the entire accumulation channel layer is depleted, as a matter of course, carriers are not present in the undoped layer and the δ-doped layer. Accordingly, the ACCUFET exhibits a high breakdown voltage. These effects and benefits are as disclosed in Japanese Patent Applications No. 2002-500456 and 2001-566193.

Particularly, in this embodiment, since a source region does not have to be formed by ion implantation, the fabrication process can be simplified. Since SiC is a very hard material, ions need to be implanted with high energy while implantation energy is changed many times, resulting in a large amount of labor required. However, according to this embodiment, the ion implantation step for forming the source region can be saved, leading to a simplified fabrication process and reduced fabrication cost.

Furthermore, in this embodiment, a bias can be supplied from the source electrode 111 through the contact region 105 to the well region 103 even without forming a recess. Since SiC is a very hard material, a large amount of labor is required for etching. However, according to this embodiment, the etching step for forming the source electrode can be saved, leading to a simplified fabrication process and reduced fabrication cost.

Figure 15:
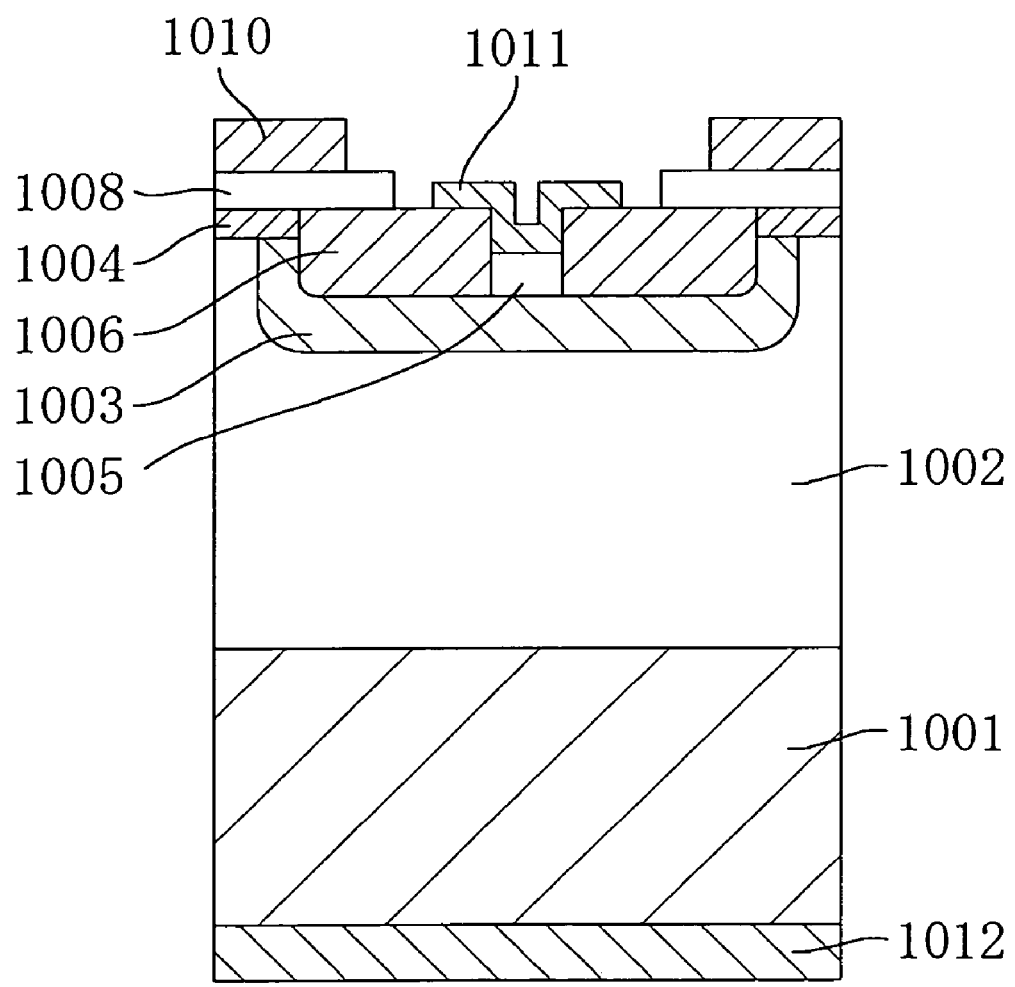
FIG. 15 is a cross sectional view showing a known double-implanted, accumulation-mode MISFET (ACCUFET) using SiC.

In the semiconductor device of this embodiment, unlike the known semiconductor device shown in FIG. 15, carriers are supplied from the source electrode 111, not via the source region, directly to the δ-doped layer 104a. Therefore, no problem is caused in the operation of the semiconductor device. If anything, the on-state resistance can be further reduced.

"Process Steps for Fabricating Semiconductor Device"

FIGS. 3A through 3F are cross sectional views showing process steps for fabricating a semiconductor device according to the first embodiment.

Figure 3A:
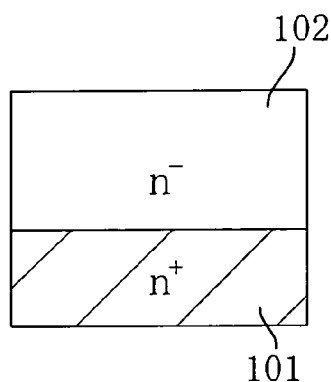
FIGS. 3A through 3F are cross sectional views showing process steps for fabricating a semiconductor device according to the first embodiment.

First, in the step shown in FIG. 3A, a SiC substrate 101 is prepared in which the surface inclined at an angle of 8° from the (0001) plane in the <11-20> direction ((0001) off plane) provides the principal surface and the doping concentration of an n-type impurity (nitrogen) is approximately $1 \times 10^{18}$ cm$^{-3}$ through $5 \times 10^{19}$ cm$^{-3}$. A high-resistance SiC layer 102 is epitaxially grown thereon. At this time, the high-resistance SiC layer 102 is epitaxially grown to contain a lower concentration of an impurity (dopant) than the SiC substrate 101 by thermal chemical-vapor deposition (CVD), e.g., using silane and propane as source gases, hydrogen as a carrier gas, and nitrogen gas as a dopant gas. For example, if a MISFET having a breakdown voltage of 600V is to be fabricated, it is desirable that the dopant concentration of the high-resistance SiC layer 102 ranges from $1 \times 10^{15}$ cm$^{-3}$ to $1 \times 10^{16}$ cm$^{-3}$ and its thickness is 10 μm or more.

Figure 3B:
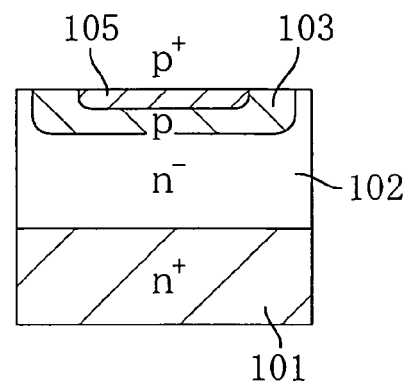

Next, in the step shown in FIG. 3B, ions of aluminum (Al) or boron (B) that are p-type impurities are implanted into a part of the high-resistance SiC layer 102 to form a well region 103. For the formation of the well region 103, first, a silicon oxide film (not shown) of approximately 3 μm thickness serving as an implantation mask is deposited on the high-resistance SiC layer 102 by CVD or the like. Then, a part of the silicon oxide film in which the well region 103 is to be formed is opened by photolithography and dry etching. Thereafter, in order to reduce ion implantation defects, ions of Al or B are implanted into the opened part of the silicon oxide film with the substrate temperature kept at a high temperature of 500° C. or higher. After this ion implantation, the silicon oxide film is totally removed by hydrofluoric acid. The dopant concentration in the well region 103 usually ranges approximately from $1 \times 10^{17}$ cm$^{-3}$ to $1 \times 10^{18}$ cm$^{-3}$, and its depth is around 1 μm such that the well region 103 does not pinch off.

Next, in order to bring the well region 103 into contact with an electrode, ions of a p-type impurity (Al or B) are implanted into the surface part of the well region 103 at a high concentration, thereby forming a contact region 105 of a p$^+$ type. The thickness of the contact region 105 is around 300 nm, and its doping concentration is $1 \times 10^{18}$ cm$^{-3}$ or more. In this case, ion implantation is carried out like the well region 103. Thereafter, activation annealing is performed in an inert gas, such as argon, at around 1700° C. for approximately half an hour.

Figure 3C:
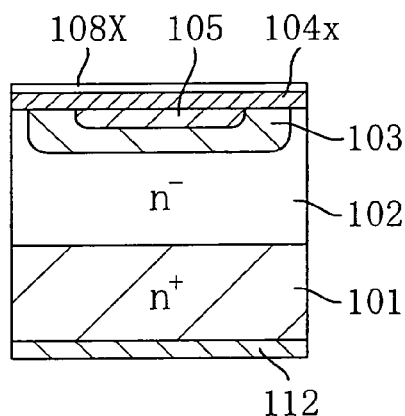

Subsequently, in the step shown in FIG. 3C, a multiple δ-doped layer 104x serving as a channel of a MISFET is formed on the surfaces of the high-resistance SiC layer 102, the well region 103 and the contact region 105. The multiple δ-doped layer 104x has a structure in which two 40 nm-thick undoped layers 104b (first semiconductor layers) and two 10 nm-thick δ-doped layers 104a (second semiconductor layers) having a peak concentration of an n-type dopant of $1 \times 10^{18}$ cm$^{-3}$, are alternately stacked, and a 40 nm-thick undoped layer 104b is further stacked thereon.

A crystal growing device and a crystal growing method both disclosed in Japanese Patent Application No. 2001-566193 are used to fabricate such a structure. More particularly, a SiC substrate is placed in a growth furnace for thermal CVD, hydrogen and argon are allowed to flow therethrough as diluent gases, and propane gas and silane gas are introduced into the growth furnace as source gases. The inside of the growth furnace is kept at a pressure of 0.0933 MPa, and the substrate temperature is adjusted at 1600° C. In this state, 40 nm-thick undoped layers are epitaxially grown. In order to form a doped layer, not only the above-mentioned diluent gases and source gases are supplied into the growth furnace, but also nitrogen is pulsatingly supplied as a doping gas thereinto. In such a state, 10 nm-thick δ-doped layers 104a are epitaxially grown. The dopant concentration is controlled by adjusting the on/off time width or duty ratio of each pulse of a pulse valve. With this method, a multiple δ-doped layer 104x is formed by alternately depositing three undoped layers 104b and two δ-doped layers 104a.

Next, the surface of the multiple δ-doped layer 104x (undoped layer 104b) is thermally oxidized, thereby forming a silicon oxide film 108x. At this time, for example, the SiC substrate is placed in a quartz tube, bubbled oxygen is introduced into the quartz tube at a flow rate of 2.5 (1/min), and thermal oxidation is carried out for three hours with the substrate temperature kept at 1100° C. As a result, a thermal oxide film is formed to have a thickness of approximately 40 nm.

Next, a 200 nm-thick drain electrode 112 composed of a nickel film is formed on the back surface of the SiC substrate 101 by vapor deposition. The drain electrode 112 is subjected to annealing after the later formation of a source electrode.

Figure 3D:
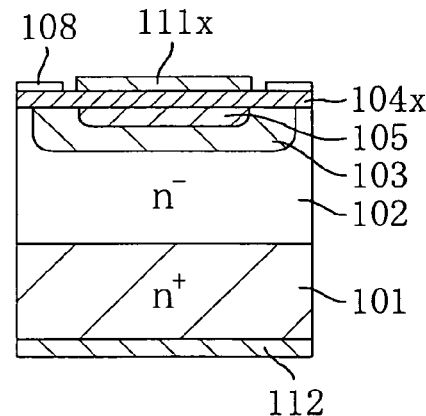

Next, in the step shown in FIG. 3D, a resist film (not shown) having an opened region where a source electrode is to be formed is formed on the silicon oxide film 108x by photolithography. Thereafter, the silicon oxide film 108x is patterned by hydrofluoric acid etching to form a gate insulating film 108 to surround the region where a source electrode is to be formed. Next, a 200 nm-thick nickel film (Ni film) is successively deposited on the substrate by vacuum deposition or the like with the resist film left. Thereafter, a nickel film 111x is left by a lift-off technique.

Figure 3E:
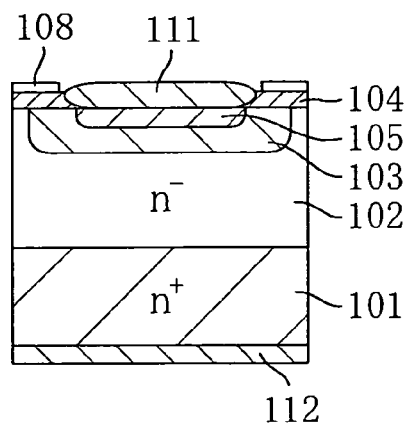

Next, in the step shown in FIG. 3E, the Ni film 111x is subjected to annealing, for example, in the atmosphere of an inert gas, such as nitrogen, at a temperature of 1000° C. for two minutes. During this annealing, interdiffusion and reaction are caused between nickel (Ni) and silicon carbide (SiC), thereby forming a source electrode 111 principally composed of nickel silicide. Then, a part of the multiple δ-doped layer 104x which is not integrated into the source electrode 111 forms an accumulation channel layer 104.

Figure 14:
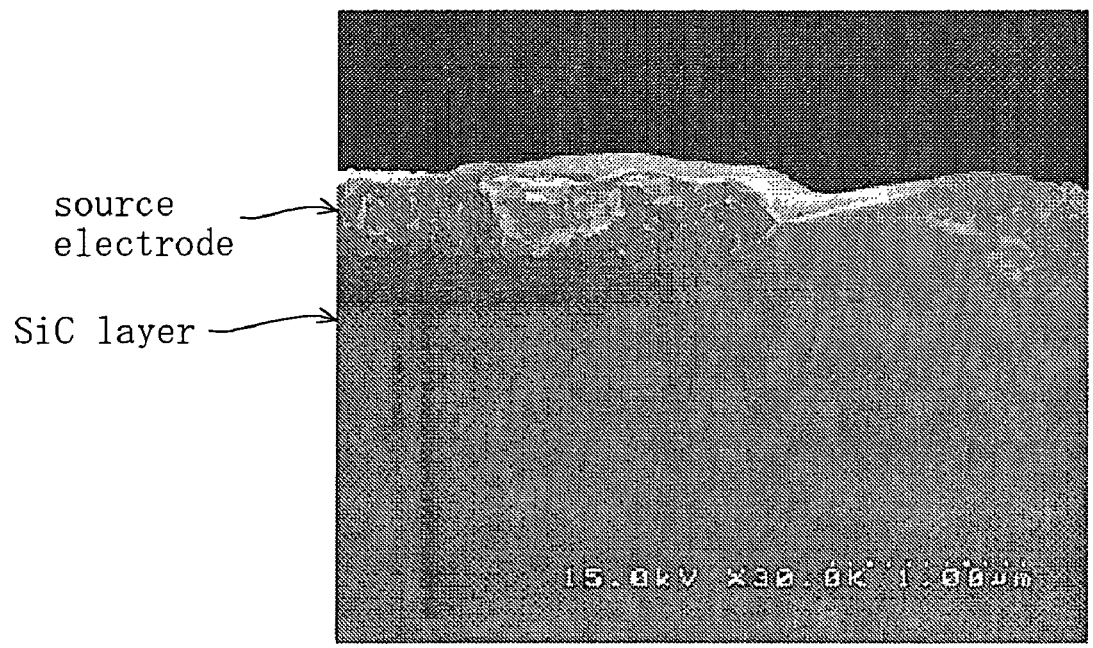
FIG. 14 is a SEM (scanning electron microscope) photographic view showing the structures of the source electrode formed in the step shown in FIG. 3E and an underlying SiC layer.

FIG. 14 is a SEM (scanning electron microscope) photographic view showing the structures of the source electrode formed in the step shown in FIG. 3E and an underlying SiC layer. As shown in this figure, it is found that the source electrode is embedded into the substrate from the substrate surface to a depth of approximately 200 nm. Although a multiple δ-doped layer is not formed in a sample of which this SEM photograph was taken, it is found that the source electrode 111 composed of nickel silicide can be sufficiently brought into contact with the contact region 105. The reason for this is that the thickness of the multiple δ-doped layer 104x in this embodiment is 140 nm.

Figure 3F:
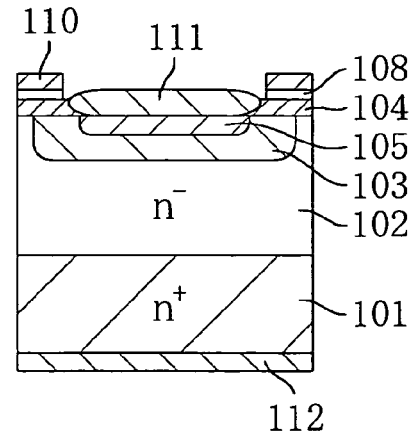

Next, in the step shown in FIG. 3F, an aluminum film is deposited on the substrate by vapor deposition, and thereafter the aluminum film is patterned by photolithography and wet etching, thereby forming a gate electrode 110 on the gate insulating film 108.

When ions are implanted into the SiC layer as in the known technique at this time, for example, the following processes are required. First, an implantation mask composed of a silicon oxide film or the like is formed on the substrate to cover the substrate except the region thereof into which n-type impurity ions are to be implanted and open the region. Thereafter, the substrate is heated to have a temperature of 500 through 800° C., and nitrogen ions (N$^+$) or the like are implanted into the substrate from above the implantation mask. Furthermore, annealing for impurity activation is performed at a temperature of 1500° C. for half an hour. As a result, a heavily-doped ion implantation layer is formed to have an n-type impurity concentration of about $1\times10^{18}$ atoms·cm$^{-3}$. At this time, nitrogen ions (N$^+$) are implanted into the substrate, for example, in six ion implantation process steps with different implantation energies. For example, the conditions for the first ion implantation are an acceleration voltage of 180 keV and a dose amount of $1.5\times10^{14}$ atoms·cm$^{-2}$, the conditions for the second ion implantation are an acceleration voltage of 130 keV and a dose amount of $1\times10^{14}$ atoms·cm$^{-2}$, the conditions for the third ion implantation are an acceleration voltage of 110 keV and a dose amount of $5\times10^{13}$ atoms·cm$^{-2}$, the conditions for the fourth ion implantation are an acceleration voltage of 100 keV and a dose amount of $8\times10^{13}$ atoms·cm$^{-2}$, the conditions for the fifth ion implantation are an acceleration voltage of 60 keV and a dose amount of $6\times10^{13}$ atoms·cm$^{-2}$, and the conditions for the sixth ion implantation are an acceleration voltage of 30 keV and a dose amount of $5\times10^{13}$ atoms·cm$^{-2}$. The depth of the ion implantation is approximately 0.3 μm.

The ion implantation process steps in the known process for fabricating a semiconductor device have had the following problem. More particularly, the underlying SiC layer is slightly etched during the formation of the opening in the implantation mask composed of a silicon oxide film or the like. Therefore, only the source region is dented so that a step is formed therein. An electric field may have been concentrated in a gate oxide film located on such a step, leading to a breakdown voltage drop.

However, in the process for fabricating a semiconductor device of this embodiment, an ACCUFET that is a MISFET can be formed even without the above-mentioned ion implantation process steps.

Figure 16:
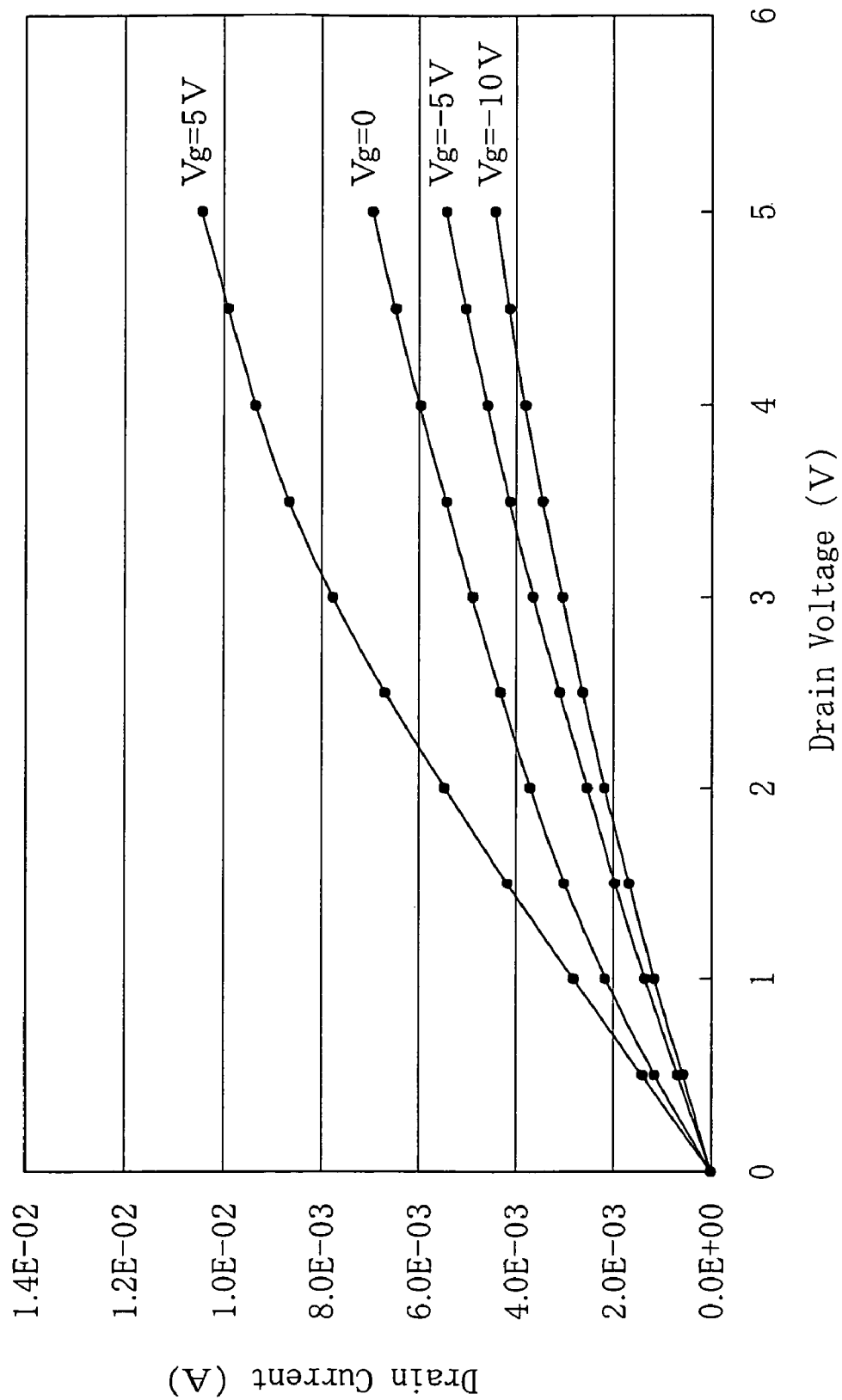
FIG. 16 is a graph showing I-V characteristics data of the double-implanted, accumulation-mode MISFET (ACCUFET) using SiC according to the first embodiment of the present invention.

FIG. 16 is a graph showing results obtained by measuring drain current (Id) to drain voltage (Vd) characteristics (I-V characteristics) of an ACCUFET formed using a method for fabricating a semiconductor device of this embodiment. Data shown in FIG. 16 were obtained by prototyping a sample of a double-implanted, accumulation-mode MISFET (ACCUFET) with a gate length of 2 μm and a total gate width of 1.2 mm through the method for fabricating a semiconductor device of this embodiment and then actually measuring its characteristics. The distance between adjacent p-type well regions in the ACCUFET as a sample is 5 μm. As found from FIG. 16, a MOS operation has surely been verified in the ACCUFET formed by the method for fabricating a semiconductor device of this embodiment.

Figure 17:
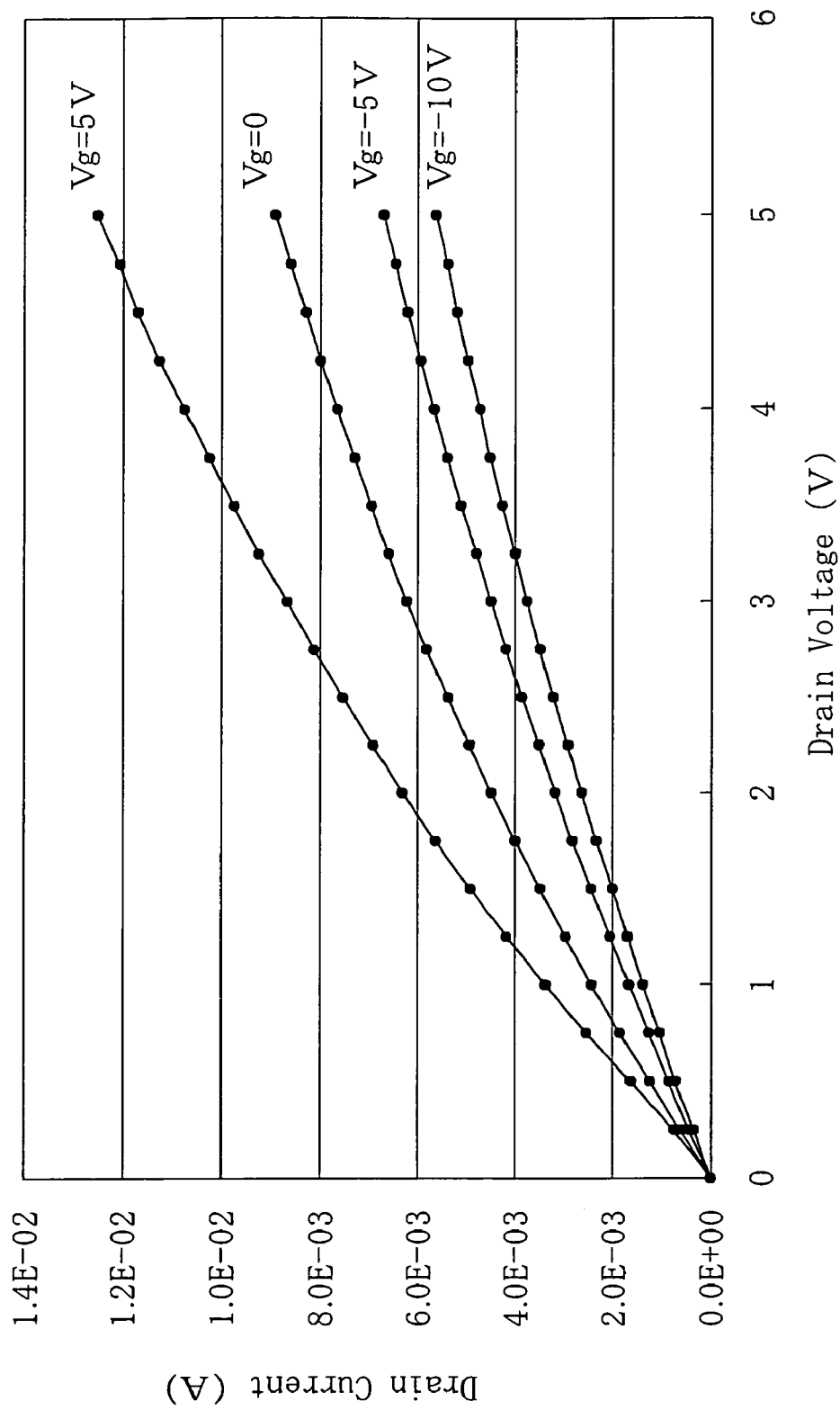
FIG. 17 is a graph showing I-V characteristics data of a conventionally configured double-implanted, accumulation-mode MISFET (ACCUFET) using SiC.

A known double-implanted, accumulation-mode MISFET (ACCUFET) shown in FIG. 15 was prototyped for comparison, and then the prototyped MISFET was compared in I-V characteristics to the ACCUFET of this embodiment. FIG. 17 is a graph showing results obtained by measuring the I-V characteristics of a known double-implanted, accumulation-mode MISFET (ACCUFET).

The difference between the fabrication process for the known ACCUFET and the fabrication process for the ACCUFET of this embodiment is only the presence or absence of formation of a source region by ion implantation, and the other process steps of both of them are identical. As seen from comparison between FIGS. 16 and 17, even when as in this embodiment the source region is not formed by ion implantation, there is no big change in the drain current value of the ACCUFET. It has not been recognized that the contact resistance increases between a source electrode directly provided in a channel and the channel.

The breakdown voltage between the source and drain was 600V when the ACCUFET of this embodiment was in the off state.

In this embodiment, the accumulation channel layer 104 is formed of the multiple δ-doped layer 104x obtained by stacking extra-thin doped layers 104a and relatively thick undoped layers 104b. Hence, the accumulation channel layer 104 with a high channel mobility can be obtained, because in the accumulation channel layer 104, carriers that have spread out from the δ-doped layers 104a under a quantum effect or the like flow through the undoped layers 104b with a high crystallinity and small scattering by impurity ions.

In the MISFET of this embodiment, the source electrode 111 substantially makes an ohmic contact with only the δ-doped layers 104a in the accumulation channel layer 104 and does not make an ohmic contact with the undoped layers 104b. However, since carriers are supplied from the δ-doped layers 104a to the undoped layers 104b, a sufficiently high drain current can be obtained.

In a normal accumulation-mode MISFET the impurity concentration in a channel layer is low. Thus, an ohmic contact is not formed even when the source electrode is brought into direct contact with the channel layer. However, since in the present invention each of the δ-doped layers contains impurities at a high concentration, the source electrode can make an ohmic contact with the δ-doped layers. Carriers are supplied from the δ-doped layers to the undoped layers.

Embodiment 2

"Structure of Semiconductor Device"

Figure 4:
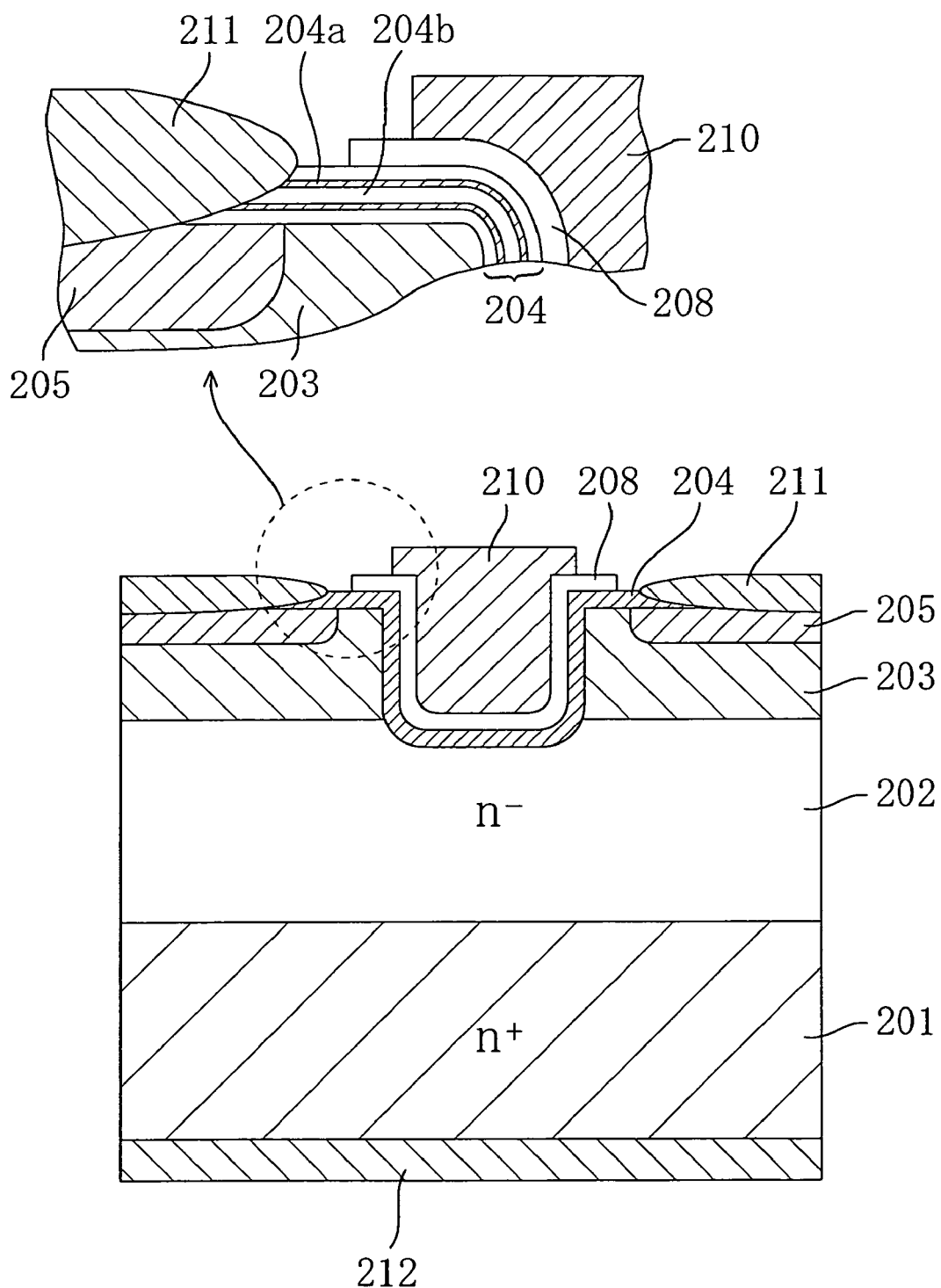
FIG. 4 is a cross sectional view showing the structure of a trench MISFET constituting a semiconductor device according to a second embodiment of the present invention.

FIG. 4 is a cross sectional view showing the structure of a trench MISFET constituting a semiconductor device according to a second embodiment of the present invention.

As shown in this figure, a trench MISFET of this second embodiment comprises a low-resistance SiC substrate 201, a high-resistance SiC layer 202 that is epitaxially grown on the SiC substrate 201 and has a higher resistance than the SiC substrate 201, a p-type base layer 203 formed by selectively implanting ions into the surface region of the high-resistance SiC layer 202, an n-type channel layer 204 having a multiple δ-doped layer (active region) formed along the wall surface of a trench which passes through part of the p-type base layer 203 and reaches the high-resistance SiC layer 202, and a contact region 205 formed by implanting a p-type impurity at a high concentration into the p-type base layer 203. A gate insulating film 208 is formed on the channel layer 204, and a gate electrode 210 is formed on the gate insulating film 208. Furthermore, a drain electrode 212 is formed on the back surface of the SiC substrate 201 to substantially make an ohmic contact with the Si substrate 201.

As shown in the upper left of FIG. 4 under magnification, the channel layer 204 has a structure in which two undoped layers (lightly-doped layers) 204b of about 40 nm thickness composed of undoped SiC single crystals and two δ-doped layers (heavily-doped layers) 204a of about 10 nm thickness having a peak concentration of n-type impurity of $1\times10^{18}$ cm$^{-3}$, are alternately stacked, and an undoped layer 204b of about 40 nm thickness is stacked thereon. The n-type doped layers 204a are formed sufficiently thin to allow spreading movement of carriers to the undoped layers 204b under a quantum effect. Such a δ-doped layer is obtained using a crystal growing device and a crystal growing method both disclosed in the specification and drawing of Japanese Patent Application No. 2001-566193. Effects and benefits brought by the provision of this multiple δ-doped layer are as disclosed in Japanese Patent Application No. 2002-500456.

This embodiment is characterized in that a source electrode 211 is provided which enters into the channel layer 204 and the contact region 205 by reaction with SiC and comes into direct contact with the contact region 205. There is formed no source region that would conventionally have been formed by implanting impurities at high concentration into the channel layer 204 and the p-type base layer 203. The source electrode 211 is composed of a nickel silicide layer obtained by forming an aluminum film and a nickel film on the channel layer 204 and then allowing nickel to react with SiC by annealing, and an aluminum alloy layer. During this annealing, nickel enters into the channel layer 204 and the contact region 205 principally by diffusion. Therefore, the source electrode 211 substantially makes an ohmic contact with the δ-doped layer 204a located in the channel layer 204 and also makes an ohmic contact with the contact region 205.

Particularly in this embodiment, a source region does not have to be formed by ion implantation. Thus, the fabrication process for a semiconductor device can be simplified. Since SiC is a very hard material, ions need to be implanted with high energy while implantation energy is changed many times, resulting in a large amount of labor required. However, according to this embodiment, the ion implantation step for forming the source region can be saved, leading to a simplified fabrication process and reduced fabrication cost.

Furthermore, in this embodiment, a bias can be supplied from the source electrode 211 through the contact region 205 to the base layer 203 even without forming a recess. Since SiC is a very hard material, a large amount of labor is required for etching. However, according to this embodiment, the etching step for forming the source electrode can be saved, leading to a simplified fabrication process and reduced fabrication cost.

In the semiconductor device of this embodiment, carriers are supplied from the source electrode 211, not via the source region, directly to the δ-doped layers 204a. Therefore, no problem is caused in the operation of the semiconductor device. If anything, the on-state resistance can be further reduced.

"Process Steps for Fabricating Semiconductor Device"

FIG. 5A through 5F are cross sectional views showing process steps for fabricating a semiconductor device according to a second embodiment.

Figure 5A:
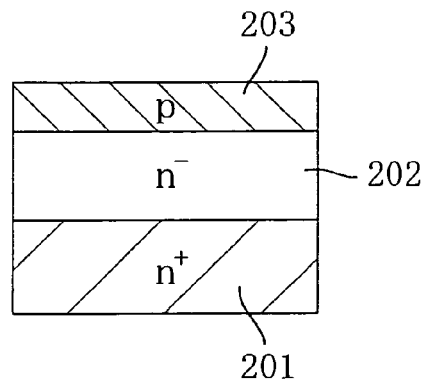
FIGS. 5A through 5F are cross sectional views showing process steps for fabricating a semiconductor device according to the second embodiment.

First, in the step shown in FIG. 5A, a SiC substrate 201 is prepared in which the surface inclined at an angle of 8° from the (0001) plane in the <11-20> direction ((0001) off plane) provides the principal surface and the doping concentration of an n-type impurity (nitrogen) is approximately $1 \times 10^{18}$ cm$^{-3}$ through $5 \times 10^{19}$ cm$^{-3}$. A high-resistance SiC layer 202 is epitaxially grown thereon. At this time, the high-resistance SiC layer 202 is epitaxially grown to contain a lower concentration of an impurity (dopant) than the SiC substrate 201 by thermal chemical-vapor deposition (CVD), for example, using silane and propane as source gases, hydrogen as a carrier gas, and a nitrogen gas as a dopant gas. For example, if a MISFET having a breakdown voltage of 600V is to be fabricated, it is desirable that the dopant concentration in the high-resistance SiC layer 202 ranges from $1 \times 10^{15}$ cm$^{-3}$ to $1 \times 10^{16}$ cm$^{-3}$ and its thickness is 10 μm or more.

Next, for example, a p-type base layer 203 is epitaxially grown by thermal CVD using silane and propane as source gases, hydrogen as a carrier gas, and trimethylaluminum (TMA) as a dopant gas. At this time, it is preferable that the dopant concentration in the base layer 203 is approximately $2 \times 10^{17}$ cm$^{-3}$ and its thickness is approximately 2 μm.

Figure 5B:
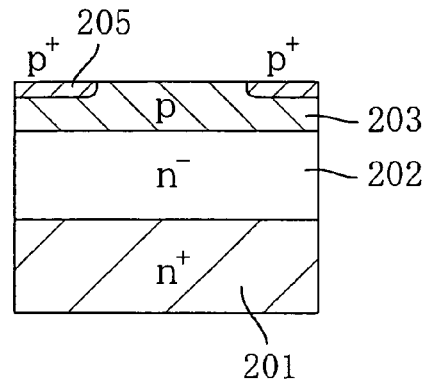

Next, in the step shown in FIG. 5B, ions of aluminum (Al) or boron (B) that are p-type impurities are implanted into a part of the base layer 203, thereby forming a heavily-doped p-type contact region 205. For the formation of the contact region 205, first, a silicon oxide film (not shown) of approximately 3 μm thickness serving as an implantation mask is deposited on the base layer 203 by CVD or the like. Then, a part of the silicon oxide film in which the contact region 205 is to be formed is opened by photolithography and dry etching. Thereafter, in order to reduce ion implantation defects, ions of Al or B are implanted into the opened part of the silicon oxide film with the substrate temperature kept at a high temperature of 500° C. or higher. After this ion implantation, the silicon oxide film is totally removed by hydrofluoric acid. It is preferable that the depth of the contact region 205 is approximately 300 nm and its dopant concentration is approximately $1 \times 10^{18}$ cm$^{-3}$. Thereafter, activation annealing is performed in an inert gas such as argon at nearly 1700° C. for approximately half an hour.

Figure 5C:
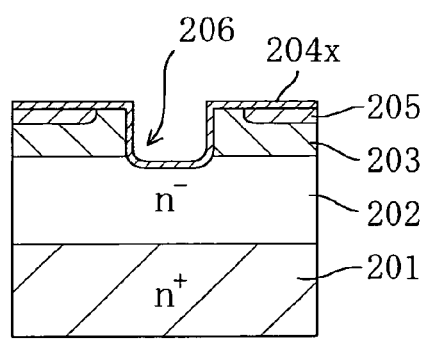

Subsequently, in the step shown in FIG. 5C, a trench 206 is formed by reactive ion etching (RIE) to pass through the base layer 203 and reach the high-resistance SiC layer 202.

Next, a multiple δ-doped layer 204x serving as a channel of a MISFET is formed along the wall surface of the trench 206, i.e., on the surfaces of the high-resistance SiC layer 202, the base layer 203 and the contact region 205. The multiple δ-doped layer 204x has a structure in which two 40 nm-thick undoped layers 204b and two 10 nm-thick δ-doped layers 204a each having a peak concentration of an n-type dopant of $1 \times 10^{18}$ cm$^{-3}$, are alternately stacked, and a 40 nm-thick undoped layer 204b is further stacked thereon.

A crystal growing device and a crystal growing method both disclosed in the specification and drawings of Japanese Patent Application No. 2001-566193 are used to fabricate such a structure. More particularly, the SiC substrate is placed in a growth furnace for the thermal CVD, hydrogen and argon are allowed to flow therethrough as diluent gases, and propane gas and silane gas are introduced into the growth furnace as source gases. The inside of the growth furnace is kept at a pressure of 0.0933 MPa, and the substrate temperature is adjusted at 1600° C. In this state, 40 nm-thick undoped layers 204b are epitaxially grown. In order to form a doped layer, not only the above-mentioned diluent gases and source gases are supplied into the growth furnace, but also nitrogen is pulsatingly supplied as a doping gas thereinto. In such a state, 10 nm-thick δ-doped layers 204a are epitaxially grown. The dopant concentration is controlled by adjusting the on/off time width or the duty ratio of each pulse of a pulse valve. With this method, a multiple δ-doped layer 204x is formed by alternately depositing three undoped layers 204b and two δ-doped layers 204a.

Figure 5D:
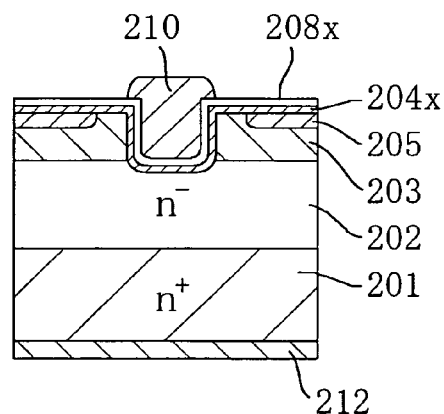

Next, in the step shown in FIG. 5D, the surface of the multiple δ-doped layer 204x (undoped layer 204b) is thermally oxidized, thereby forming a silicon oxide film 208x. At that time, for example, the SiC substrate is placed in a quartz tube, bubbled oxygen is introduced into the quartz tube at a flow rate of 2.5 (l/min), and thermal oxidation is carried out for three hours with the substrate temperature kept at 1100° C. As a result, a thermal oxide film is formed to have a thickness of approximately 40 nm.

Next, a gate electrode 210 is formed on the silicon oxide film 208x. At that time, an n-type or p-type low-resistance polysilicon film is deposited on the surface of the silicon oxide film 208x, for example, by low-pressure CVD (LPCVD), using disilane and hydrogen as source gases, and phosphine or diborane as a dopant gas. Thereafter, the polysilicon film is patterned by photolithography and dry etching, thereby forming a gate electrode 210 to fill the trench 206.

Next, a 200 nm-thick drain electrode 212 composed of a nickel film is formed on the back surface of the SiC substrate 201 by vapor deposition. The drain electrode 212 is subjected to annealing after the later formation of a source electrode.

Figure 5E:
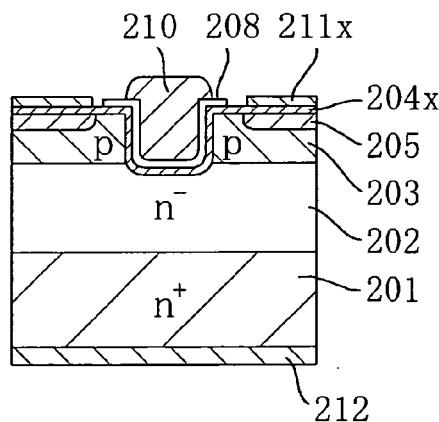

Next, in the step shown in FIG. 5E, a resist film (not shown) having an opened region where a source electrode is to be formed is formed on the silicon oxide film 208x by photolithography. Thereafter, the silicon oxide film 208x is patterned by hydrofluoric acid etching to form a gate insulating film 208. Next, a 200 nm-thick nickel film (Ni film) is successively deposited on the substrate by vacuum deposition or the like with the resist film left. Thereafter a Ni film 211x is left by a lift-off technique.

Figure 5F:
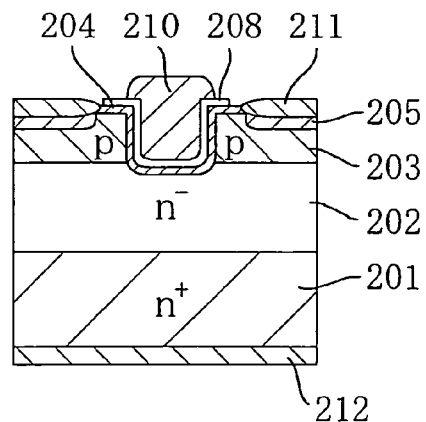

Next, in the step shown in FIG. 5F, the Ni film 211x is subjected to annealing, for example, in the atmosphere of an inert gas, such as nitrogen, at a temperature of 1000° C. for two minutes. During this annealing, interdiffusion and reaction are caused between nickel (Ni) and silicon carbide (SiC), thereby forming a source electrode 211 principally composed of nickel silicide. Then, a part of the multiple δ-doped layer 204x which is not integrated into the source electrode 211 forms a channel layer 204. At this time, the nickel film located on the back surface of the SiC substrate 201 also forms nickel silicide, thereby forming a drain electrode 212.

A trench MISFET with a gate length of 2 μm and a total gate width of 2.1 mm was prototyped using the method for fabricating a semiconductor device of this embodiment, and then measured for characteristics. The measurement result showed a characteristic that the drain current is 9.51 mA at a gate voltage of 5V and a drain-to-source voltage of 2V. This value is substantially the same drain current as that of the known trench MISFET in which a source region is formed by ion implantation. The breakdown voltage between the source and drain was 600V when the MISFET of this embodiment was in the off state.

In this embodiment, the channel layer 204 is formed of the multiple δ-doped layer 204x obtained by stacking extra-thin doped layers 204a and relatively thick undoped layers 204b. Hence, a channel layer 204 with a high channel mobility can be obtained, because in the channel layer 204, carriers that have spread out from the δ-doped layers 204a under a quantum effect or the like flow through the undoped layers 204b with a high crystallinity and small scattering by impurity ions.

In the MISFET of this embodiment, the source electrode 211 substantially makes an ohmic contact with only the δ-doped layers 204a in the channel layer 204 and does not make an ohmic contact with the undoped layers 204b. However, since carriers are supplied from the δ-doped layers 204a to the undoped layers 204b, a sufficiently high drain current can be obtained.

Embodiment 3

Figure 6:
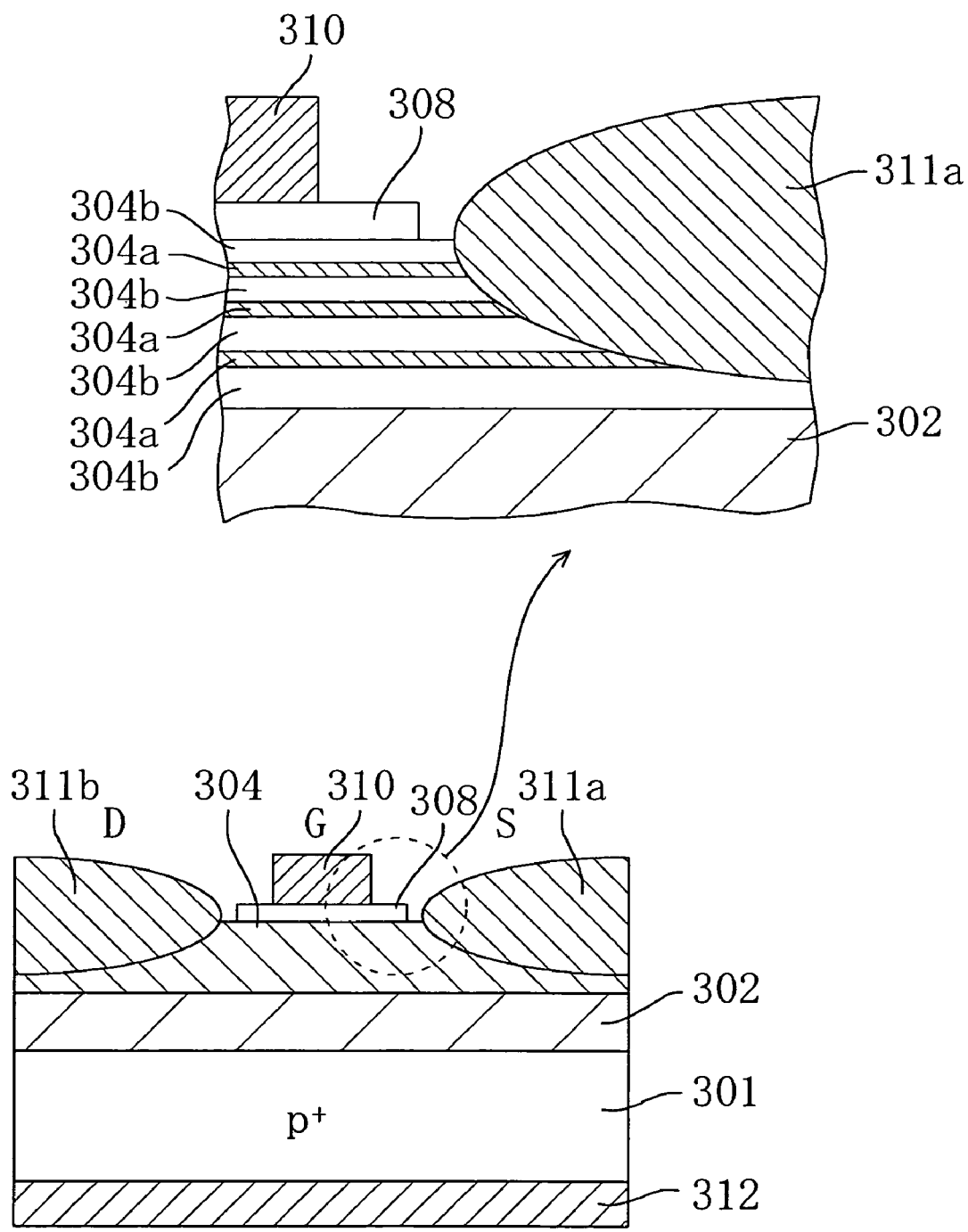
FIG. 6 is a cross sectional view showing a schematic structure of a lateral p-channel MISFET according to a third embodiment.

FIG. 6 is a cross sectional view showing a schematic structure of a lateral p-channel MISFET according to a third embodiment. As shown in this figure, on an n-type SiC substrate 301 doped with nitrogen (n-type impurity) at a concentration of $1\times10^{18}$ atoms·cm$^{-3}$, there are provided an n-type base region 302 doped with nitrogen at a mean concentration of about $1\times10^{17}$ atoms—cm$^{-3}$, a multiple δ-doped layer 304 (active region) formed in the base region 302, a gate insulating film 308 of SiO$_2$ formed on the multiple δ-doped layer 304, a gate electrode 310 composed of a Ni alloy film formed on the gate insulating film 308, source and drain electrodes 311a and 311b composed of a Ni alloy film contacting the multiple δ-doped layer 304 and the base region 302, and a back-surface electrode 312 composed of a Ni alloy film in ohmic contact with the back surface of the SiC substrate 301.

As shown in the right part of FIG. 6 under magnification, the multiple δ-doped layer 304 is composed of three δ-doped layers 304a of about 10 nm thickness containing aluminum at a high concentration (e.g., $1\times10^{18}$ atoms·cm$^{-3}$) and serving as a p-type doped layer and four undoped layers 304b of about 40 nm thickness composed of undoped SiC single crystals, which are alternately stacked. The p-type doped layer 304a is formed sufficiently thin to allow spreading movement of carriers to the undoped layer 304b under a quantum effect. Thus, the effects as disclosed in Japanese Patent Application No 2002-500456 can be achieved.

A source region and a drain region as in a MISFET disclosed in Japanese Patent Application No. 2002-500456 (see FIG. 1 of the same document) are not provided in the MISFET of this embodiment. The source and drain electrodes 311a and 311b enter into the substrate to substantially make an ohmic contact with the p-type doped layers 304a. Therefore, as in the first and second embodiments, the effect that ion implantation process steps for forming the source region and the like become unnecessary can be achieved.

Although not shown graphically, process steps for fabricating the MISFET according to this embodiment are as follows: in a method for fabricating a MISFET according to a first embodiment of Japanese Patent Application No. 2000-500456, a Ni film is formed on a region of a substrate where source and drain electrodes are to be formed without ion implantation process steps for forming source and drain regions, and Ni is diffused into the substrate by heat treatment of the Ni film. As a result, source and drain electrodes composed of a nickel alloy film are formed.

More particularly, also when the present invention is applied to a lateral MISFET having a channel layer made of a multiple δ-doped layer, ion implantation process steps for forming source and drain regions can be saved, leading to reduction in fabrication cost.

Embodiment 4

Figure 7:
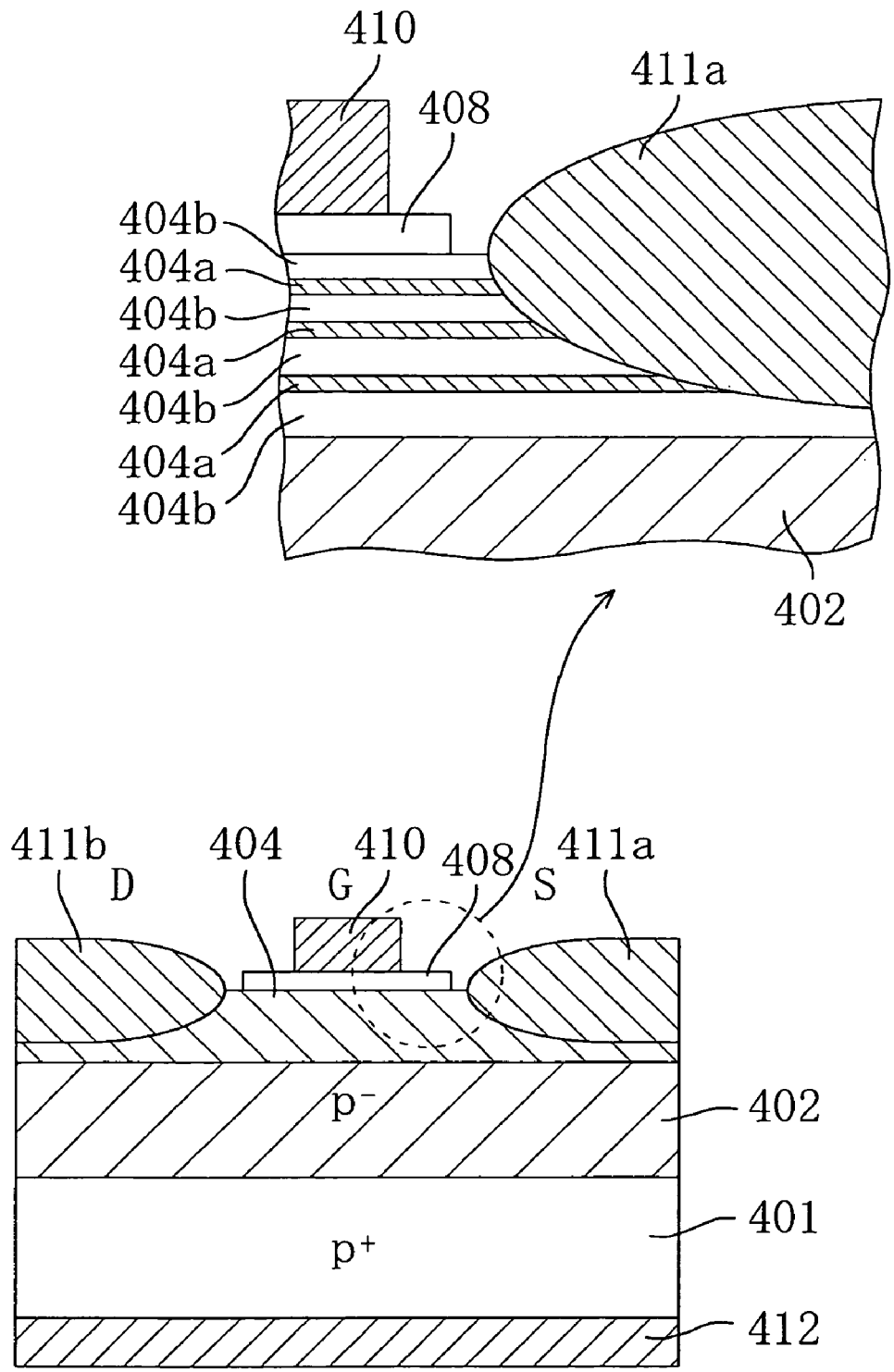
FIG. 7 is a cross sectional view showing the structure of an ACCUFET according to a fourth embodiment of the present invention.

FIG. 7 is a cross sectional view showing the structure of an ACCUFET according to a fourth embodiment of the present invention. As shown in this figure, on a p-type SiC substrate 401 doped with aluminum (p-type impurity) at a concentration of $1\times10^{18}$ atoms·cm$^{-3}$, there are provided a p-type lower region 402 doped with aluminum at a mean concentration of about $1\times10^{17}$ atoms·cm$^{-3}$, an n-type multiple δ-doped layer 404 (active region) formed on the lower region 402 and doped with nitrogen at a mean concentration of about $1\times10^{17}$ atoms·cm$^{-3}$, a gate insulating film 408 of SiO$_2$ formed on the multiple δ-doped layer 404, a gate electrode 410 of a Ni alloy film formed on the gate insulating film 408, source and drain electrodes 411a and 411b of a Ni alloy film contacting the multiple δ-doped layer 404 and the lower region 402, and a back-surface electrode 412 of an Al/Ni layered film in ohmic contact with the back surface of the SiC substrate 401.

As shown in the right part of FIG. 7 under magnification, the multiple δ-doped layer 404 is composed of three δ-doped layers 404a of about 10 nm thickness containing nitrogen at a high concentration (e.g., $1\times10^{18}$ atoms·cm$^{-3}$) and four undoped layers 404b of about 40 nm thickness composed of undoped SiC single crystals, which are alternately stacked. The δ-doped layer 404a is formed sufficiently thin to allow spreading movement of carriers to the undoped layer 404b under a quantum effect. Thus, the effects as disclosed in Japanese Patent Application No 2002-500456 can be achieved. More particularly, during operation, quantum levels resulting from a quantum effect occur in the δ-doped layer 404a, and the wave function of electrons localized in the δ-doped layer 404a expands to a certain degree. What results is a state of distribution in which electrons are present not only in the δ-doped layer 404a but also in the undoped layer 404b. If the potential of the multiple δ-doped layer 404 is increased in this state so that electrons have spread out from the δ-doped layer 404a to the undoped layer 404b due to a quantum effect, electrons are constantly supplied to the δ-doped layer 404a and the undoped layer 404b. Since the electrons flow in the undoped layer 404b of low impurity concentration, carrier scattering by impurity ions is reduced, thereby providing a high channel mobility. On the other hand, when the device is in the off state, the whole multiple δ-doped layer 404 is depleted and electrons are not present in the multiple δ-doped layer 404. Therefore, the breakdown voltage is defined by the undoped layer 404b of low impurity concentration, so that a high breakdown voltage can be obtained in the entire multiple δ-doped layer 404. Accordingly, in the ACCUFET having a structure in which the multiple δ-doped layer 404 is utilized to pass a large current between the source and drain, a high channel mobility and a high breakdown voltage can be achieved at the same time.

Source and drain regions as in an ACCUFET disclosed in Japanese Patent Application No. 2002-500456 (see FIG. 7 of the same document) are not provided in the ACCUFET of this embodiment. The source and drain electrodes 411a and 411b enter into the substrate to substantially make an ohmic contact with the p-type doped layers 404a. Therefore, as in the first and second embodiments, the effect that ion implantation process steps for forming the source region and the like become unnecessary can be achieved.

Although not shown graphically, process steps for fabricating the MISFET according to this embodiment are as follows: in a method for fabricating a MISFET according to a first embodiment of Japanese Patent Application No. 2000-500456, a Ni film is formed on a region of a substrate where source and drain electrodes are to be formed without ion implantation process steps for forming source and drain regions, and Ni is diffused into the substrate by heat treatment of the Ni film. As a result, source and drain electrodes composed of a nickel alloy film are formed.

More particularly, also when the present invention is applied to a lateral ACCUFET having a channel layer made of a multiple δ-doped layer, ion implantation process steps for forming source and drain regions can be saved, leading to reduction in fabrication cost.

Embodiment 5

Figure 8:
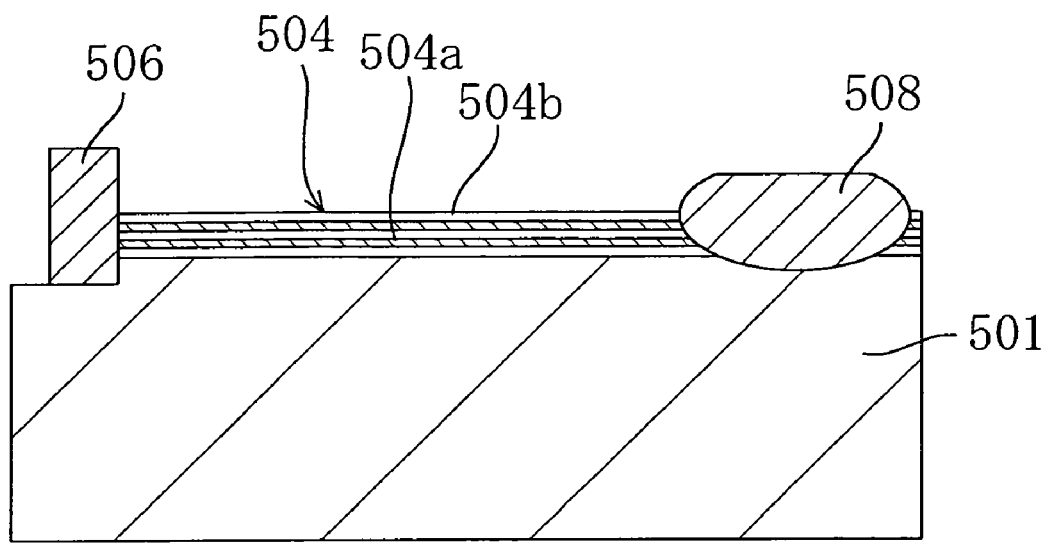
FIG. 8 is a cross sectional view showing a schematic structure of a Schottky diode constituting a power semiconductor device according to a fifth embodiment of the present invention.

FIG. 8 is a cross sectional view showing a schematic structure of a Schottky diode constituting a power semiconductor device according to a fifth embodiment.

As shown in this figure, a multiple δ-doped layer 504 (active region) formed basically by the same method as described in the first embodiment is provided on the principal surface of an n-type SiC substrate 501 which is the (0001) off plane. The multiple δ-doped layer 504 is formed such that three 40 nm-thick undoped layers 504b (lightly-doped layers) each having a nitrogen concentration of about $5 \times 10^{15}$ atoms·cm$^{-3}$ and three 10 nm-thick δ-doped layers 504a (heavily-doped layers) each having a peak concentration of nitrogen of $1 \times 10^{18}$ atoms·cm$^{-3}$ are alternately stacked. The thickness of the SiC substrate 501 is about 100 μm. The SiC substrate 501 is not doped with impurities to substantially become a semi-insulating state.

In this embodiment, a Schottky electrode 506 is provided not on top of the multiple δ-doped layer 504 but on its side. More particularly, a trench is formed by trenching the multiple δ-doped layer 504 to reach the SiC substrate 501, and a Schottky electrode 506 composed of Ni alloy is provided on the side of this trench to form a Schottky contact with the sides of both the δ-doped layers 504a and undoped layers 504b of the multiple δ-doped layer 504. An ohmic electrode 508 composed of a Ni alloy film is provided in a region of the multiple δ-doped layer 504 a certain distance away from the Schottky electrode 506 to contact the multiple δ-doped layer 504 and the SiC substrate 501. The spacing between the Schottky electrode 506 and the ohmic electrode 508 is about 10 μm.

The effects of the Schottky diode in this embodiment are as described in a third embodiment of the specification of Japanese Patent Application No. 2001-566193. That is, the Schottky diode can keep the resistance value of the entire multiple δ-doped layer 504 small, thereby realizing a low power consumption and a large current density.

In this embodiment, a doped lead layer provided in the Schottky diode described in Japanese Patent Application No. 2001-566193 (see FIG. 8 of the same document) is unnecessary. That is, an ion implantation process step for forming the doped lead layer becomes unnecessary. Therefore, as in the first and second embodiments, reduction in fabrication cost can be achieved.

The structure of the Schottky diode shown in FIG. 8 is formed in accordance with the following procedure. First, a semi-insulating SiC substrate 501 is placed in a crystal growing device. Then, the CVD described in the first embodiment is performed so that undoped layers 504b of about 40 nm thickness and δ-doped layers 504a of about 10 nm thickness are alternately grown epitaxially, thereby forming a multiple δ-doped layer 504. Next, the multiple δ-doped layer 504 and the SiC substrate 501 are partly removed by dry etching to form a trench. Thereafter, an ohmic electrode 508 composed of Ni alloy is formed in the multiple δ-doped layer 504 by formation of a Ni film and subsequent annealing. Next, a Schottky electrode 506 composed of Ni alloy is formed on the side wall of the trench. A method for forming the ohmic electrode 508 is as described in the first embodiment.

Embodiment 6

Figure 9:
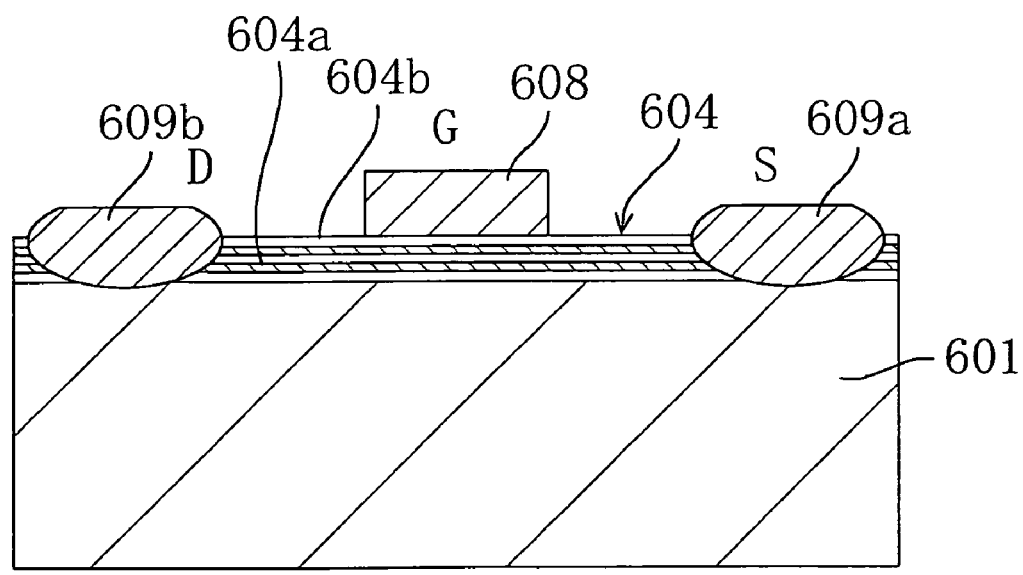
FIG. 9 is a cross sectional view showing a schematic structure of a MESFET constituting a power semiconductor device according to a sixth embodiment of the present invention.

FIG. 9 is a cross sectional view showing a schematic structure of a MESFET constituting a power semiconductor device according to a sixth embodiment.

As shown in this figure, a multiple δ-doped layer 604 (active region) formed basically by the same method as described in the first embodiment is provided on the principal surface of an n-type SiC substrate 601 which is the (0001) off plane. The multiple δ-doped layer 604 is formed such that three 40 nm-thick undoped layers 604b (lightly-doped layers) each having a nitrogen concentration of about $5 \times 10^{15}$ atoms·cm$^{-3}$ and three 10 nm-thick δ-doped layers 604a (heavily-doped layers) each having a peak concentration of nitrogen of $1 \times 10^{18}$ atoms·cm$^{-3}$ are alternately stacked. The thickness of the SiC substrate 601 is about 100 μm. The SiC substrate 601 is not doped with impurities to substantially become a semi-insulating state.

In this embodiment, on the uppermost undoped layer 604b of the multiple δ-doped layer 604, there are provided a gate electrode 608 that is a Schottky electrode of Ni alloy forming a Schottky contact with the undoped layer 604b, and source and drain electrodes 609a and 609b that are ohmic electrodes of Ni alloy opposed to each other with the gate electrode 608 interposed therebetween. The gate length of the gate electrode 608 is about 1 μm.

During the operation of the MESFET of this embodiment, quantum levels resulting from a quantum effect occur in the δ-doped layer 604a, and the wave function of electrons localized in the δ-doped layer 604a expands to a certain degree. What results is a state of distribution in which electrons are present not only in the δ-doped layer 604a but also in the undoped layer 604b. If the potential of the multiple δ-doped layer 604 is increased in this state so that electrons have spread out from the δ-doped layer 604a to the undoped layer 604b due to a quantum effect, electrons are constantly supplied to the δ-doped layer 604a and the undoped layer 604b. Since the electrons flow in the undoped layer 604b of low impurity concentration, carrier scattering by impurity ions is reduced, thereby providing a high channel mobility. On the other hand, when the device is in the off state, the whole multiple δ-doped layer 604 is depleted and electrons are not present in the multiple δ-doped layer 604. Therefore, the breakdown voltage is defined by the undoped layer 604b of low impurity concentration, so that a high breakdown voltage can be obtained in the whole multiple δ-doped layer 604. Accordingly, in the MESFET having a structure in which the multiple δ-doped layer 604 is utilized to pass a large current between the source and drain, a high channel mobility and a high breakdown voltage can be achieved at the same time.

In addition, a substantial ohmic contact with each of the δ-doped layers 604a of the multiple δ-doped layer 604 can be maintained without forming source and drain regions by ion implantation. Therefore, the MESFET can handle a large current while keeping the fabrication cost low, thereby enhancing the value as a power device.

The structure of the MESFET shown in FIG. 9 is formed in accordance with the following procedure. First, a semi-insulating SiC substrate 601 is placed in a crystal growing device. Then, the CVD described in the first embodiment is performed so that three undoped layers 604b and two δ-doped layers 604a are alternately grown epitaxially on the SiC substrate 601, thereby forming a multiple δ-doped layer 604. Next, a Ni film is formed on the substrate. Then, source and drain electrodes 609a and 609b are formed to contact the multiple δ-doped layer 604 and the SiC substrate 601 by carrying out annealing under the conditions described in the first embodiment. The source and drain electrodes 609a and 609b make an ohmic contact with the δ-doped layers 604a of the multiple δ-doped layer 604. Next, an ohmic electrode 608 composed of Ni alloy is formed on the substrate. After the formation of the gate electrode 608, the gate electrode 608 is held in Schottky contact with the uppermost undoped layer 604b of the multiple δ-doped layer 604, without the above-mentioned heat treatment.

Embodiment 7

Next, a description will be given of a semiconductor device obtained by integrating active elements such as a transistor or a diode and passive elements such as a capacitor or an inductor on a substrate. The active and passive elements are placed in each of circuits of communication system equipment as in a base station. The semiconductor device of this embodiment can be placed in communication system equipment, in such a base station, as disclosed in Japanese Patent Application No. 2001-350923 filed by the present inventors.

"Structure of Semiconductor Device"

Figure 10:
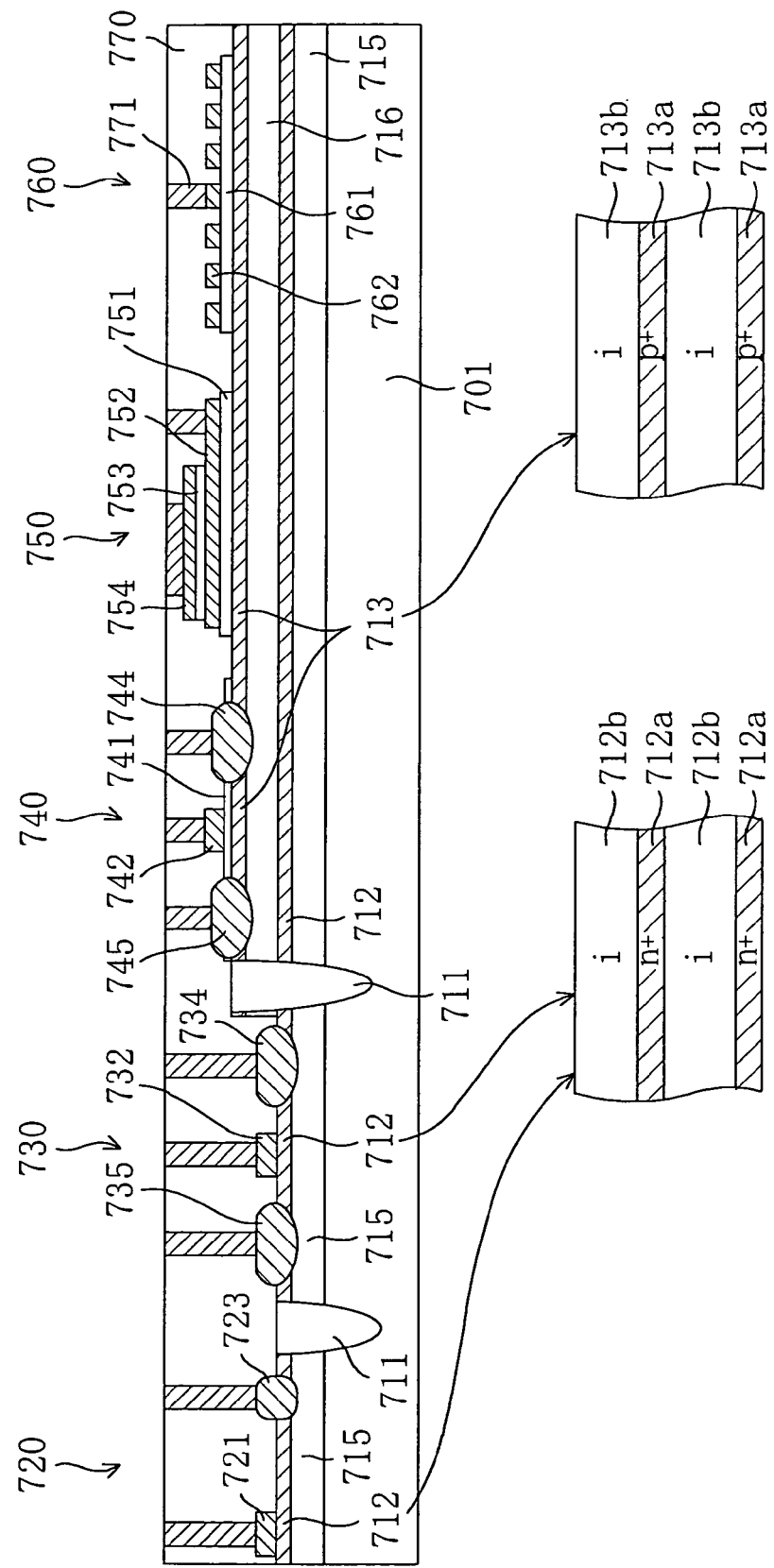
FIG. 10 is a cross sectional view showing a semiconductor device (semiconductor integrated circuit device) according to a seventh embodiment of the present invention.

FIG. 10 is a cross sectional view showing a semiconductor device (semiconductor integrated circuit device) according to a seventh embodiment of the present invention, which is obtained by integrating, on a SiC substrate, the Schottky diode, MESFET and MISFET described in the above embodiments and a capacitor and an inductor.

On a SiC substrate 701 which is a 4H—SiC substrate, several layers are stacked in bottom-up order, consisting of: a first lightly-doped layer 715 containing an n-type impurity (nitrogen) at a low concentration; a first multiple δ-doped layer 712 (active region) obtained by alternately stacking δ-doped layers containing an n-type impurity (nitrogen) at a high concentration and undoped layers; a second lightly-doped layer 716 containing a p-type impurity (aluminum) at a low concentration; and a second multiple δ-doped layer 713 (active region) obtained by alternately stacking δ-doped layers containing a p-type impurity (aluminum) at a high concentration and undoped layers. The second multiple δ-doped layer 713 and the second lightly-doped layer 716 are partly removed such that the first multiple δ-doped layer 712 is partly exposed at the top of the substrate. Isolation regions 711, each composed of a silicon dioxide film filling in a trench, are formed for dividing the multiple δ-doped layers 712 and 713 and the lightly-doped layers 715 and 716 on a per element basis. Both of the lightly-doped layers 715 and 716 may be undoped layers.

As shown in the lower part of FIG. 10 under magnification, the first multiple δ-doped layer 712 is composed of two δ-doped layers 712a of about 10 nm thickness containing nitrogen at a high concentration (e.g., $1 \times 10^{18}$ atoms·cm$^{-3}$) and two undoped layers 712b of about 40 nm thickness composed of undoped 4H—SiC single crystals, which are alternately stacked. On the other hand, the second multiple δ-doped layer 713 is composed of two δ-doped layers 713a that are p-type doped layers of about 10 nm thickness containing aluminum at a high concentration (e.g., $1 \times 10^{18}$ atoms·cm$^{-3}$) and two undoped layers 713b of about 40 nm thickness composed of undoped 4H—SiC single crystals, which are alternately stacked. Each of the δ-doped layers 712a and the p-type doped layers 713a is formed sufficiently thin to allow spreading movement of carriers to the undoped layer 712b or 713b under a quantum effect.

As described above, the semiconductor device according to this embodiment comprises the multilayer portion (multiple δ-doped layer) composed of the δ-doped layers 712a or 713a and the undoped layers 712b or 713b which are alternately stacked. Such a structure in which heavily-doped layers (δ-doped layers) and lightly-doped layers (undoped layers) are alternately stacked is obtainable as described later by using the crystal growing device and the crystal growing method disclosed in the specifications and drawings of Japanese Patent Applications No. 2000-58964 and 2000-06210. Specifically, an epitaxial growing method using in-situ doping is used by simultaneously effecting the supply of a dopant gas using a pulse valve (termed pulse doping) and the supply of a source gas.

A Schottky diode 720 (rectifying element) and a MESFET 730 (power amplifier) are provided on the portion of the SiC substrate 701 at which the first multiple δ-doped layer 712 is exposed, while an nMISFET 740 (switching element), a capacitor 750 (capacitive element), and an inductor 760 (inductive element) are provided on the portion of the SiC substrate 701 at which the second multiple δ-doped layer 713 is located on top of the doped layers. More particularly, a MESFET, a diode, a capacitor, and an inductor each constituting a main amplifier for handling an RF signal in a communication circuit and a MISFET placed in a normal signal processing unit or the like are provided on a single SiC substrate 701.

The Schottky diode 720 comprises: a Schottky electrode 721 of nickel (Ni) alloy in Schottky contact with the first multiple δ-doped layer 712; and an ohmic electrode 723 of nickel (Ni) alloy in ohmic contact with the δ-doped layer 712a of the first multiple δ-doped layer 712.

The MESFET 730 comprises: a Schottky gate electrode 732 of a Ni alloy film in Schottky contact with the undoped layer 712b that is the uppermost layer of the first multiple δ-doped layer 712; and source and drain electrodes 734 and 735 provided in the regions of the first multiple δ-doped layer 712 located to both sides of the gate electrode 732, respectively, and making an ohmic contact with each of the δ-doped layers 712a of the first multiple δ-doped layer 712.

The nMISFET 740 comprises: a gate insulating film 741 of $SiO_2$ formed on the second multiple δ-doped layer 713; a gate electrode 742 composed of a Ni alloy film formed on the gate insulating film 741; and source and drain electrodes 744 and 745 composed of a Ni alloy film in ohmic contact with each of the p-type doped layers 713a of the second multiple δ-doped layer 713. It is needless to say that a pMISFET can be provided by forming an insulating gate electrode, source and drain electrodes and the like in a certain region of the first multiple δ-doped layer 712.

The capacitor 750 comprises: an underlying insulating film 751 composed of a SiN film provided on the second multiple δ-doped layer 713; a lower electrode 752 composed of a platinum (Pt) film provided on the underlying insulating film 751; a capacitor insulating film 753 composed of a high-dielectric-constant film such as BST provided on the lower electrode 752; and an upper electrode 754 composed of a platinum (Pt) film opposed to the lower electrode 752 with the capacitor insulating film 753 interposed therebetween.

The inductor 760 comprises: a dielectric film 761 composed of a SiN film provided on the second multiple δ-doped layer 713; and a conductor film 762 composed of a spiral Cu film formed on the dielectric film 761. The conductor film 762 has a width of about 9 μm and a thickness of about 4 μm. The spacing between adjacent parts of the conductor film 762 is about 4 μm. However, since the SiC substrate 701 has a high heat resistance and a high heat conductivity, the conductor film 762 can be scaled down to a smaller pattern depending on the amount of current. For example, a configuration can be formed which has a width of about 1 to 2 μm and a spacing of about 1 to 2 μm.

An interlevel insulating film 770 composed of a silicon oxide film is formed on the substrate. Wiring (not shown) composed of an aluminum alloy film, a Cu alloy film, or the like is provided on the interlevel insulating film 770. The elements 720, 730, 740, 750, and 760 have respective conductor portions connected to the wiring via contacts 771. Each contact 771 is composed of an aluminum alloy film or the like and fills in a contact hole formed in the interlevel insulating film 770. In this manner, circuits in communication system equipment as in a base station are constructed.

However, all the circuits in the communication system equipment are not necessarily provided on a single SiC substrate. Any of the circuits may be provided on another substrate (silicon substrate). For example, although the transmitting amplifier and the receiving amplifier in the communication system equipment, each requiring a power element, are provided on the SiC substrate, the baseband processor requiring no power element may be provided on a silicon substrate.

In this embodiment, the principal ones of the devices in the communication system equipment are mounted on a single SiC substrate so that a required circuit is scaled down, as shown in FIG. 10. Accordingly, each of the circuits in the communication system equipment can be scaled down and the total thickness of the circuits is only on the order of the sum of the thickness of the SiC substrate and the respective thicknesses of the multilayer film and the interlevel insulating film. Therefore, the whole communication system equipment has an extremely thin structure. In other words, the size of the communication system equipment itself can be reduced. In particular, integration is facilitated since a MESFET, a Schottky diode, a MOSFET, and the like can be provided on a single SiC substrate by forming the Schottky diode into a lateral configuration, as shown in FIG. 10. A further size reduction is achievable by mounting even passive elements such as an inductor and a capacitor on the common SiC substrate.

In addition, since a minimum of doped layers formed by implanting ions into the SiC layer are provided in the entire semiconductor integrated circuit device, process steps for implanting ions into the SiC layer, in particular, requiring a large amount of labor, can be saved, leading to reduction in fabrication cost.

The temperature ensuring normal operations of the MESFET and the Schottky diode both formed on the SiC substrate is around 400° C. This remarkably eases various constraints due to a low upper-limit temperature of 150° C., like those placed in the case where a conventional FET provided on a Si substrate is assumedly used. That is, even if all the elements are positioned in close proximity, this embodiment seldom encounters problems associated with heat resistance because the MESFET and Schottky diode on the SiC substrate are high in heat resistance. Since the circuit can be scaled down significantly, placement flexibility at the base station is held high. Since the SiC substrate has a high heat conductivity and an excellent heat releasing property, the elements within the circuit can easily be prevented from being adversely affected by heat dissipation from the power amplifier.

As a result, there is provided a semiconductor device having the characteristics of high power and a high breakdown voltage and suitable for use at a base station or mobile station in a communication system. In the case where the semiconductor device is placed at the base station, it can withstand a long-term use without the provision of a cooling device having a particularly high cooling ability because of the high heat resistance of the SiC substrate. This reduces installation cost for cooling facilities and running cost for power and the like. In the case where the semiconductor device is placed at a mobile station, such degradation of characteristics as caused by a temperature rise under the use of a GaAs substrate can be suppressed in spite of the placement of the MESFET in close proximity to a heat-generating element such as an inductor. This eases constraints on the placement of the semiconductor device at the mobile station and scales down the whole mobile station.

By integrating a majority of elements in communication system equipment as in a base station or mobile station into a common SiC substrate, the labor of assembling parts can be saved and the fabrication cost for the semiconductor device can be reduced. The element having a multilayer portion composed of stacked δ-doped and lightly-doped layers increases the reliability of the device, and therefore an increased production yield can be expected. The increased production yield provides cost reduction.

If the semiconductor device is applied to equipment for handling an RF signal on the GHz order, in particular, the dielectric film 761 of the inductor 760 is preferably composed of a BCB (benzocyclobutene) film. The BCB film is a film containing, in its structure, BCB obtained by dissolving a BCB-DVS monomer in a solvent, applying the resulting solution on the δ-doped layer 713, and baking the applied solution. The BCB film features a relative dielectric constant as low as about 2.7 and easy formation of a film as thick as about 30 μm by a single step of application. Since the tan δ of the BCB film is about 0.006 at 60 GHz, which is lower than that of $SiO_2$ by one order of magnitude, the BCB film has particularly excellent characteristics as a dielectric film forming an inductor or a microstrip line.

"Fabrication Process"

Figure 12A:
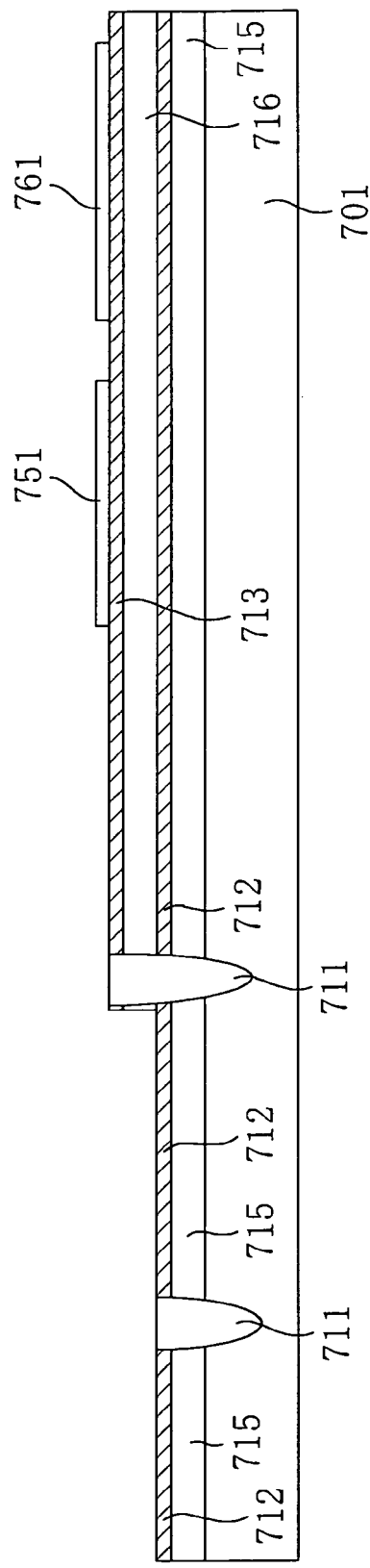
FIGS. 12A and 12B are cross sectional views showing the process steps from formation of an insulating film to formation of an electrode or a conductor film of each of elements in the fabrication process for a semiconductor device according to the eighth embodiment.
Figure 12B:
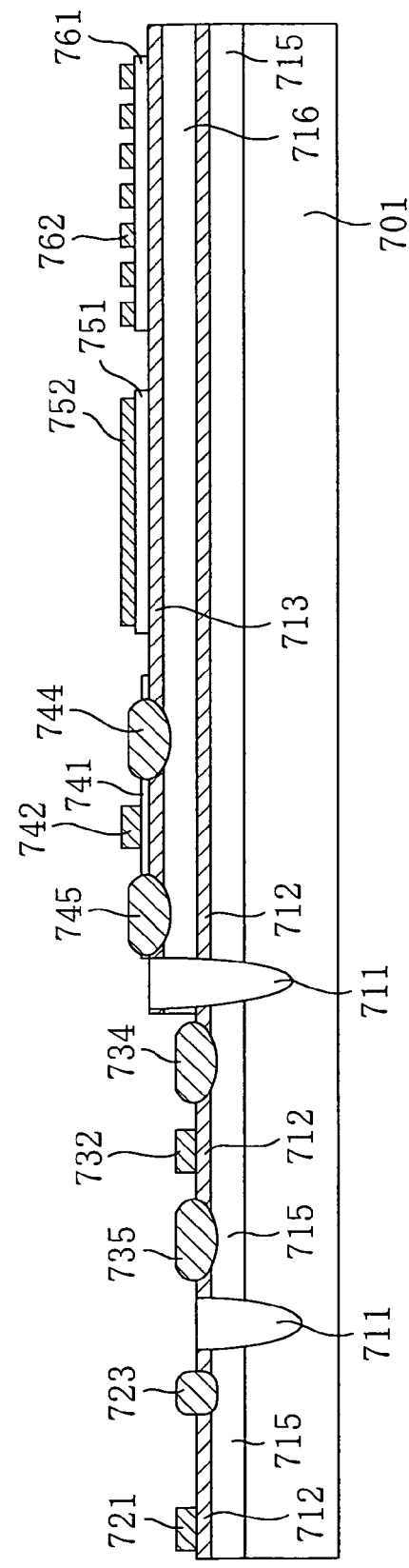

Next, process steps for fabricating a semiconductor device of this embodiment will be described with reference to FIGS. 11A through 13B. FIG. 11A through 11C are cross sectional views showing the process steps from formation of first and second multilayer portions to formation of an isolation region in a fabrication process for a semiconductor device according to this embodiment. FIGS. 12A and 12B are cross sectional views showing the process steps from formation of an insulating film to formation of an electrode or a conductor film of each element in the fabrication process for a semiconductor device according to this embodiment. FIGS. 13A and 13B are cross sectional views showing the process steps from formation of an upper electrode of a capacitor to formation of a contact hole leading to a conductor part of each element in the fabrication process for a semiconductor device according to this embodiment. A crystal growing device and a crystal growing method according to this embodiment are based on the structure and method disclosed in the specifications and drawings of Japanese Patent Applications No. 2000-58964 and 2000-06210.

First, in the step shown in FIG. 11A, a p-type SiC substrate 710 is prepared. In this embodiment, a 4H—SiC substrate having the principal surface coincident in orientation with the {11-20} plane (A plane) is used as the SiC substrate 701. It is also possible to use a SiC substrate having the principal surface several degrees deviated in orientation from the (0001) plane (C plane).

In a water vapor atmosphere bubbled with oxygen at a flow rate of 5 (1/min), the SiC substrate 701 is thermally oxidized at 1100° C. for about 3 hours, thereby forming a thermal oxide film with a thickness of about 40 nm on a surface of the SiC substrate 701. Then, the thermal oxide film is removed in a buffered fluoric acid (fluoric acid:aqueous ammonium fluoride solution=1:7). The SiC substrate 701 is placed in the chamber of a CVD apparatus, and the pressure in the chamber is reduced to reach a vacuum degree of about $10^{-6}$ Pa (approximately equal to $10^{-8}$ Torr). Then, hydrogen and argon are supplied as diluent gases (carrier gases) into the chamber and at flow rates of 1 and 2 (1/min), respectively, the pressure in the chamber is adjusted to 0.0933 MPa, and the substrate temperature is adjusted to about 1600° C. Propane and silane gases are introduced as source gases into the chamber and at flow rates of 2 and 3 (ml/min), while the respective flow rates of the hydrogen and argon gases are held at the foregoing constant values. The source gases have been diluted with hydrogen gas at a flow rate of 50 (ml/min). In the chamber, nitrogen (a doping gas) as an n-type impurity is supplied pulsatingly, while the source gases and the diluent gases are supplied. Thereby, a first lightly-doped layer 715 of about 1200 nm thickness is formed on the principal surface of the SiC substrate 701 by epitaxial growth. In this case, the doping gas, e.g., nitrogen, is contained in a high-pressure bottle and a pulse valve is provided between the high-pressure bottle and a pipe for supplying the doping gas. The doping gas can be supplied pulsatingly to a space immediately above the SiC substrate 701 in the chamber by repeatedly opening and closing the pulse valve, while supplying the source gases and the diluent gases. Instead of the first lightly-doped layer 715, an undoped layer may be formed.

Next, a δ-doped layer 712a (heavily-doped layer) of about 10 nm thickness is formed on the first lightly-doped layer 715 by epitaxial growth. A level difference in impurity concentration can be produced easily by reducing the period (pulse width) during which the pulse valve is opened during the formation of the lightly-doped layer 715 and increasing the period (pulse width) during the formation of the δ-doped layer 712a.

When the epitaxial growth of the δ-doped layer 712a is completed, the propane gas and the silane gas are supplied to the space above the SiC substrate 701 while the supply of the doping gas is halted, i.e., with the pulse valve closed completely. As a result, an undoped layer 712b (lightly-doped layer) of about 40 nm thickness composed of undoped SiC single crystals is grown epitaxially over the principal surface of the SiC substrate 701.

The two following steps as described just above are repeated three times: (i) the step of forming a δ-doped layer 712a by introducing the doping gas through the opening and closing of the pulse valve while simultaneously supplying the source gases; and (ii) the step of forming an undoped layer 712b by supplying only the source gases without supplying the doping gas. Thereby, a first multiple δ-doped layer 712 is formed in which three δ-doped layers 712a and three undoped layers 712b are alternately stacked. At this time, one undoped layer 712b is formed as the uppermost layer, and the thickness of the uppermost undoped layer 712b is adjusted to be about 10 nm larger than those of the other undoped layers 712b. A mean concentration of nitrogen in the first multiple δ-doped layer 712 is about $1\times10^{17}$ atoms-cm$^{-3}$, and the total thickness of the first multiple δ-doped layer 712 is about 190 nm.

Next, the doping gas is switched to a gas containing aluminum as a p-type impurity (doping gas), while the source gases and the diluent gases are supplied continuously. Thereby, a lightly-doped layer 716 of about 1200 nm thickness is formed on the first multiple δ-doped layer 712. As the doping gas, hydrogen gas containing about 10% of trimethyl aluminum $Al(CH_3)_3$, for example, is used.

Then, similarly to the foregoing procedure for forming the first multiple δ-doped layer 712, the two following steps are repeated three times: (i) the step of forming a p-type doped layer 713a (heavily-doped layer) of about 10 nm thickness by introducing the doping gas (hydrogen gas containing trimethyl aluminum gas) through the opening and closing of the pulse valve while simultaneously supplying the source gases, and (ii) the step of forming an undoped layer 713b of about 40 nm thickness by supplying only the source gases, while keeping the pulse valve closed so as not to supply the doping gas. Thereby, a second multiple δ-doped layer 713 is formed in which three p-type doped layers 713a and three undoped layers 713b are alternately stacked. At that time, one undoped layer 713b is formed as the uppermost layer, and the thickness of the uppermost undoped layer 713b is adjusted to be about 10 nm larger than those of the other undoped layers 713b. A mean concentration of aluminum in the second multiple δ-doped layer 713 is about $1\times10^{17}$ atoms·cm$^{-3}$, and the total thickness of the second multiple δ-doped layer 713 after the completion of thermal oxidation is about 190 nm.

Next, in the step shown in FIG. 11B, the second multiple δ-doped layer 713 and the second lightly-doped layer 716 are selectively etched to remove their regions in which a Schottky diode 720 and a MESFET 730 are to be formed. As a result, the first multiple δ-doped layer 712 is exposed in each of the regions in which a Schottky diode 720 and a MESFET 730 are to be formed.

Next, in the step shown in FIG. 11C, trenches for forming isolation regions are formed in the substrate, and the trenches are filled with a silicon oxide film to form isolation regions 711.

Next, in the step shown in FIG. 12A, the implantation mask is removed and then a SiN film of about 0.4 µm thickness is formed by plasma CVD on the substrate. Thereafter, the SiN film is patterned to form an underlying insulating film 751 and a dielectric film 761 on the respective regions of the second multiple δ-doped layer 713 on which a capacitor 750 and an inductor 760 are to be formed.

Next, in the step shown in FIG. 12B, in the region where a MISFET is to be formed, a surface portion (corresponding to a thickness of about 10 nm) of the uppermost undoped layer 713b of the second multiple δ-doped layer 713 is thermally oxidized at a temperature of about 1100° C. As a result, a gate insulating film 741 composed of a thermal oxide film is formed to have a thickness of about 20 nm. Then, openings are formed by removing the portions of the gate insulating film 741 in which source and drain electrodes are to be formed, and a Ni film serving as source and drain electrodes 744 and 745 is deposited therein by vacuum vapor deposition. Thereafter, the deposited Ni film is patterned in the form of electrodes. At the same time, a Ni film serving as an ohmic electrode 723, a source electrode 734, and a drain electrode 735 is deposited on the first multiple δ-doped layer 712 of the Schottky diode 720, and the deposited Ni film is patterned in the form of electrodes. Furthermore, annealing is performed on the same conditions as in the first and second embodiments to diffuse Ni of the Ni film into the multiple δ-doped layers. As a result, source electrodes 734 and 744, drain electrodes 735 and 745, and an ohmic electrode 723 are formed, each to make an ohmic contact with the heavily-doped layers of the corresponding multiple δ-doped layer. Subsequently, a nickel (Ni) alloy film is vapor-deposited on the gate insulating film 741 to form a gate electrode 742 composed of the nickel alloy film and having a gate length of about 1 µm. On the other hand, nickel (Ni) is vapor-deposited on the regions of the first multiple δ-doped layer 712 on which a Schottky diode 720 and a MESFET 730 are to be formed so that Schottky electrodes 721 and a Schottky gate electrode 732 each composed of nickel are formed. Further, platinum (Pt) is vapor-deposited on the underlying insulating film 751 of the capacitor 750 to form a lower electrode 752 composed of platinum.

Next, a resist film having a spiral opening is formed on the region on which an inductor 760 is to be formed. A Cu film of about 4 µm thickness is deposited on the resist film and lifted off, whereby a spiral conductor film 762 is left on the dielectric film 761. It is also possible to form a conductor film of an aluminum alloy film instead of the Cu film. In that case, the aluminum alloy film is deposited and patterned by RIE dry etching using $Cl_2$ gas and $BCl_3$ gas, thereby forming a spiral conductor film 762.

Next, in the step shown in FIG. 13A, a BST film is formed by sputtering on the lower electrode of the capacitor 750. Then, a platinum (Pt) film is formed by vapor deposition on the BST film. The platinum film and the BST film are patterned into a specified configuration to form an upper electrode 754 and a capacitance insulating film 753.

Next, in the step shown in FIG. 13B, an interlevel insulating film 770 composed of a silicon oxide film is deposited on the substrate. The interlevel insulating film 770 is formed with contact holes 774 reaching the Schottky electrode 721 and ohmic electrode 723 of the Schottky diode 720, the Schottky gate electrode 732 and source and drain electrodes 734 and 735 of the MESFET 730, the gate, source, and drain electrodes 742, 744, and 745 of the nMISFET 740, the upper and lower electrodes 754 and 752 of the capacitor 750, and the center and outer circumferential end portions of the spiral conductor film 762 of the inductor 760.

Thereafter, an aluminum alloy film is formed in each of the contact holes 774 and on the interlevel insulating film 770 and patterned to provide the structure of the semiconductor device shown in FIG. 10.

Thus, the fabrication method according to this embodiment allows easy formation of a Schottky diode, a MESFET, a MOSFET, a resistor element, an inductor, and the like on a single SiC substrate, while a minimum number of process steps of implanting ions into the SiC layer are carried out. Since a MESFET and a Schottky diode can be provided on the common SiC substrate by forming active elements, including the MESFET and the Schottky diode, in a lateral configuration, integration is particularly facilitated. Since a passive element such as an inductor can also be mounted on the common SiC substrate, further scaling down is achievable.

Other Embodiments

Although in the above embodiments electrodes are formed of a Ni film by diffusing Ni into the heavily-doped layer of the multiple δ-doped layer composed of SiC to make an ohmic contact with the heavily-doped layer, a Ti film, a W film, a TiW film, a TiN film, an Al film, an AlNi film, a TiAl film, or the like, may be used instead of the Ni film. In order to make a complete ohmic contact, when the multiple δ-doped layer is an n-type layer, a Ni film, Ti, a Ti film, a W film, a TiW film, a TiN film, or the like is preferably used as the electrodes. On the other hand, when the multiple δ-doped layer is a p-type layer, an Al film, an AlNi film, a TiAl film, or the like is preferably used as the electrodes. However, in some cases, low resistance can practically be obtained without making a physically complete ohmic contact. Thus, the above combination is not restrictive. In particular, when a metal film for electrodes on the p-type multiple δ-doped layer and a metal film for electrodes on the n-type multiple δ-doped layer are simultaneously subjected to annealing for an ohmic contact, the metal films of the same material are preferably provided in both of the p-type multiple δ-doped layer and the n-type multiple δ-doped layer.

In the case of a SiC layer, nickel is diffused from the Ni film into the SiC layer to form a nickel silicide layer. However, when the source electrode is formed of another material, e.g., a Ti film, it is considered that titanium is diffused into the SiC layer to form titanium carbide. In this manner, the diffusion of metal into the SiC layer is considered to result in the formation of some alloy or mixed material. As long as the metal is a material that has the property of diffusing into the multiple δ-doped layer and provides a low-resistance electrode, any kind of metal films may be used.

In the above embodiments, a SiC substrate is used as a substrate and active elements are provided to operate using the SiC layer as an active layer. However, the above embodiments can also be applied to all kinds of semiconductor devices which can be provided on a compound semiconductor substrate made of, for example, GaN and InP (i.e., using a layer made of GaN, AlGaN, InGaN, InAlGaN, or the like as an active layer) other than a semiconductor device provided on the SiC substrate. For example, when an InP substrate is used, an AuGe film or the like can be used as a conductor film for electrodes. When a GaN substrate is used, a Ti/Pt/Au multilayer film, an Au/Zn/Ni multilayer film or the like can be used as a conductor film for electrodes. Also in these cases, a multilayer portion obtained by stacking δ-doped layers and lightly-doped layers (including undoped layers) is provided below the gate insulating film. Therefore, a channel mobility and a breakdown voltage can be improved, and concurrently a minimum number of ion implantation steps for forming source and drain regions and a doped lead layer can be carried out.

In the above embodiments, at least two heavily-doped layers (δ-doped layers) and at least one undoped layer (lightly-doped layer) need only exist in the multiple δ-doped layer.

According to the semiconductor device of the present invention and the method for fabricating the same, there are provided an active region constituting a multiple δ-doped layer and electrodes each entering into the active region from the surface thereof to contact at least the δ-doped layer. Therefore, a semiconductor device with high performance, such as high power and a high breakdown voltage, using a compound semiconductor, can be reduced in fabrication cost.

INDUSTRIAL APPLICABILITY

A semiconductor device of the present invention can be utilized, in particular, for a MISFET, a MESFET, a Schottky diode, an inductor, and the like in a high power device and a high-frequency device.

The invention claimed is:

1. A semiconductor device comprising:
   a substrate;
   a first silicon carbide layer formed on the substrate and made of silicon carbide containing an impurity of a first conductivity type;
   a second silicon carbide layer formed on the first silicon carbide layer and made of silicon carbide; and
   at least one electrode comprising a metal,
   wherein the second silicon carbide layer consists of at least one first semiconductor layer and at least two second semiconductor layers,
   the first semiconductor layer and the second semiconductor layers are alternately stacked,
   the first semiconductor layer is composed of a compound semiconductor and serves as a region through which carriers flow,
   the second semiconductor layers are composed of a compound semiconductor and contain an impurity of the first conductivity type for carriers at a higher concentration than the first semiconductor layer and are thinner than the first semiconductor layer, and
   a metal that is the constituent material of the electrode diffuses into the second silicon carbide layer from the top side to directly contact at least each of the second semiconductor layers.

2. The semiconductor device of claim 1, further comprising:
   a gate insulating film provided on the active region; and
   a gate electrode provided on the gate insulting film,
   wherein the at least one electrode is either one of source and drain electrodes, and the semiconductor device serves as a MISFET.

3. The semiconductor device of claim 2, wherein the semiconductor device serves as an accumulation-mode MISFET.

4. The semiconductor device of claim 1, further comprising:
   a Schottky gate electrode provided on the active region,
   wherein the at least one electrode is source and drain electrodes provided with the gate electrode interposed therebetween, and the semiconductor device serves as a MESFET.

5. The semiconductor device of claim 1, further comprising:
   a Schottky gate electrode making a Schottky contact with the active region,
   wherein the electrode is a single ohmic electrode, and the semiconductor device serves as a lateral Schottky diode.

6. The semiconductor device of any one of claims 1 through 5, wherein the compound semiconductor layer is a SiC layer.

7. The semiconductor device of claim 6, wherein
   the at least one electrode is composed of a conductor material containing at least nickel.

8. The semiconductor device of claim 1, wherein
   a first impurity region containing an impurity of the second conductivity type is formed on the first silicon carbide layer and a second impurity region is formed on the first impurity region, said second impurity region containing an impurity of the second conductivity type at a higher concentration than the first impurity region, and the electrode directly contacts the second impurity region.

9. A method for fabricating a semiconductor device, said method comprising the steps of:
   forming on a substrate a first silicon carbide layer made of silicon carbide containing an impurity of a first conductivity type;
   (a) forming on the first silicon carbide layer a second silicon carbide layer consisting of at least one first semiconductor layer and at least two second semiconductor layers that are alternately stacked, said second semiconductor layers containing an impurity of a first conductivity type for carriers at a higher concentration than the first semiconductor layer and being thinner than the first semiconductor layer;
   (b) depositing a metal film on the second silicon carbide layer and then patterning the deposited metal film in the form of an electrode; and
   (c) subjecting the metal film to annealing after the step (b), thereby forming an electrode including the metal that diffuses into the second silicon carbide layer from the top side to directly contact at least each of the second semiconductor layers.

10. The method for fabricating a semiconductor device of claim 9, wherein
    in the step (c), the electrode is brought into an ohmic contact with at least each of the second semiconductor layers.

11. The method for fabricating a semiconductor device of claim 9 or 10, wherein
    the conductor film contains at least nickel, and
    in the step (c), the annealing is carried out at a high temperature of 600° C. or higher in an atmosphere of an inert gas.

12. The method for fabricating a semiconductor device of claim 9, further comprising the sub-steps of:
    forming in an upper part of the first silicon carbide layer a first impurity region containing an impurity of the second conductivity type; and
    forming in an upper part of the first impurity region a second impurity region containing an impurity of the second conductivity type at a higher concentration than the first impurity region.

* * * * *

UNITED STATES PATENT AND TRADEMARK OFFICE
CERTIFICATE OF CORRECTION

| | |
|---|---|
| PATENT NO. | : 7,507,999 B2 |
| APPLICATION NO. | : 10/494705 |
| DATED | : March 24, 2009 |
| INVENTOR(S) | : Osamu Kusumoto et al. |

It is certified that error appears in the above-identified patent and that said Letters Patent is hereby corrected as shown below:

On the title page of the patent, in Item "(75) Inventors", change "Kunimasa Takahashi, Ibaraki (JP)" to --Kunimasa Takahashi, Osaka (JP)--;

Change "Kenya Yamashita, Kadoma (JP)" to --Kenya Yamashita, Osaka (JP)--; and

Change "Masao Uchida, Ibaraki (JP)" to --Masao Uchida, Osaka (JP)--.

In Item "(56) References Cited", in the reference "HSU, W.C. et al.", change the word "Oragnic" to --Organic--; and Add reference "WANG, Shui Jinn., et al. "Schottky/Two-Dimensional Hole Gas Silicon Barrier Diodes with Single and Coupled Delta-Doped Wells.", Japanese Journal of Applied Physics, Volume 33, No 4B, pp. 2429-2434, Publication Office Japanese Journal of Applied Physics, 1994".

Signed and Sealed this

Fourteenth Day of July, 2009

JOHN DOLL
*Acting Director of the United States Patent and Trademark Office*